(12) United States Patent
Das et al.

(10) Patent No.: US 10,418,350 B2
(45) Date of Patent: Sep. 17, 2019

(54) SEMICONDUCTOR STRUCTURES FOR ASSEMBLY IN MULTI-LAYER SEMICONDUCTOR DEVICES INCLUDING AT LEAST ONE SEMICONDUCTOR STRUCTURE

(71) Applicant: Massachusetts Institute of Technology, Cambridge, MA (US)

(72) Inventors: Rabindra N. Das, Lexington, MA (US); Donna-Ruth W. Yost, Acton, MA (US); Chenson Chen, Waban, MA (US); Keith Warner, Whitinsville, MA (US); Steven A. Vitale, Waltham, MA (US); Mark A. Gouker, Belmont, MA (US); Craig L. Keast, Groton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/327,239

(22) PCT Filed: Aug. 11, 2015

(86) PCT No.: PCT/US2015/044679
§ 371 (c)(1),
(2) Date: Jan. 18, 2017

(87) PCT Pub. No.: WO2016/073049
PCT Pub. Date: May 12, 2016

(65) Prior Publication Data
US 2017/0162507 A1    Jun. 8, 2017

Related U.S. Application Data

(60) Provisional application No. 62/035,713, filed on Aug. 11, 2014.

(51) Int. Cl.
*H01L 25/10* (2006.01)
*H01L 21/48* (2006.01)
(Continued)

(52) U.S. Cl.
CPC .......... *H01L 25/105* (2013.01); *H01L 21/187* (2013.01); *H01L 21/30625* (2013.01);
(Continued)

(58) Field of Classification Search
None
See application file for complete search history.

(56) References Cited

U.S. PATENT DOCUMENTS 4,316,200 A    2/1982 Ames et al.
4,612,083 A    9/1986 Yasumoto et al.
(Continued)

FOREIGN PATENT DOCUMENTS

WO    WO 2016/025451 A1    2/2016
WO    WO 2016/025478 A1    2/2016
WO    WO 2017/015432 A1    1/2017

OTHER PUBLICATIONS

U.S. Appl. No. 15/303,800, filed Oct. 13, 2016, Das, et al.
(Continued)

*Primary Examiner* — Phat X Cao
*Assistant Examiner* — Diana C Vieira
(74) *Attorney, Agent, or Firm* — Daly, Crowley, Mofford & Durkee LLP

(57) ABSTRACT

A multi-layer semiconductor device includes at least a first semiconductor structure and a second semiconductor structure, each having first and second opposing surfaces. The second semiconductor structure includes a first section and a second section, the second section including a device layer and an insulating layer. The second semiconductor structure also includes one or more conductive structures and one or (Continued)

more interconnect pads. Select ones of the interconnect pads are electrically coupled to select ones of the conductive structures. The multi-layer semiconductor device additionally includes one or more interconnect structures disposed between and coupled to select portions of second surfaces of each of the first and second semiconductor structures. A corresponding method for fabricating a multi-layer semiconductor device is also provided.

20 Claims, 12 Drawing Sheets

(51) Int. Cl.

| | |
|---|---|
| H01L 23/48 | (2006.01) |
| H01L 23/522 | (2006.01) |
| H01L 23/532 | (2006.01) |
| H01L 25/065 | (2006.01) |
| H01L 25/00 | (2006.01) |
| H01L 23/538 | (2006.01) |
| H01L 23/498 | (2006.01) |
| H01L 23/00 | (2006.01) |
| H01L 21/18 | (2006.01) |
| H01L 21/306 | (2006.01) |
| H01L 21/768 | (2006.01) |
| H01L 23/528 | (2006.01) |
| H01L 27/12 | (2006.01) |
| H01L 27/06 | (2006.01) |

(52) U.S. Cl.
CPC ........ *H01L 21/486* (2013.01); *H01L 21/4846* (2013.01); *H01L 21/76898* (2013.01); *H01L 23/481* (2013.01); *H01L 23/49822* (2013.01); *H01L 23/49827* (2013.01); *H01L 23/49838* (2013.01); *H01L 23/528* (2013.01); *H01L 23/5226* (2013.01); *H01L 23/5329* (2013.01); *H01L 23/5383* (2013.01); *H01L 23/5385* (2013.01); *H01L 23/5386* (2013.01); *H01L 23/53209* (2013.01); *H01L 24/16* (2013.01); *H01L 25/00* (2013.01); *H01L 25/0657* (2013.01); *H01L 25/50* (2013.01); *H01L 27/1266* (2013.01); *H01L 23/522* (2013.01); *H01L 27/0688* (2013.01); *H01L 2224/16225* (2013.01); *H01L 2224/16227* (2013.01); *H01L 2224/73253* (2013.01); *H01L 2224/92144* (2013.01); *H01L 2225/06513* (2013.01); *H01L 2225/06541* (2013.01); *H01L 2225/06544* (2013.01); *H01L 2225/06568* (2013.01); *H01L 2225/1023* (2013.01); *H01L 2225/1058* (2013.01); *H01L 2225/1082* (2013.01); *H01L 2225/1094* (2013.01); *H01L 2924/15192* (2013.01); *H01L 2924/15311* (2013.01)

(56) References Cited

U.S. PATENT DOCUMENTS

| | | | |
|---|---|---|---|
| 5,057,877 A | 10/1991 | Briley et al. | |
| 5,156,997 A | 10/1992 | Kumar et al. | |
| 5,179,070 A | 1/1993 | Harada et al. | |
| 5,371,328 A | 12/1994 | Gutierrez et al. | |
| 5,650,353 A | 7/1997 | Yoshizawa et al. | |
| 5,773,875 A | 6/1998 | Chan | |
| 6,108,214 A | 8/2000 | Fuse | |
| 6,297,551 B1 | 10/2001 | Dudderar et al. | |
| 6,324,755 B1 | 12/2001 | Borkowski et al. | |
| 6,346,469 B1 | 2/2002 | Greer | |
| 6,355,501 B1 | 3/2002 | Fung et al. | |
| 6,396,371 B2 | 5/2002 | Streeter et al. | |
| 6,436,740 B1 | 8/2002 | Jen et al. | |
| 6,485,565 B1 | 11/2002 | Springer | |
| 6,678,167 B1 | 1/2004 | Degani et al. | |
| 6,819,000 B2 | 11/2004 | Magerlein et al. | |
| 6,825,534 B2 | 11/2004 | Chen et al. | |
| 6,838,774 B2 | 1/2005 | Patti | |
| 7,427,803 B2 | 9/2008 | Chao et al. | |
| 7,589,390 B2 | 9/2009 | Yao | |
| 7,624,088 B2 | 11/2009 | Johnson et al. | |
| 7,932,515 B2 | 4/2011 | Bunyk | |
| 7,939,926 B2 | 5/2011 | Kaskoun et al. | |
| 7,993,971 B2 | 8/2011 | Chatterjee et al. | |
| 8,159,825 B1 | 4/2012 | Dotsenko | |
| 8,202,785 B2 | 6/2012 | Castex et al. | |
| 8,354,746 B2 | 1/2013 | Huang et al. | |
| 8,466,036 B2 | 6/2013 | Brindle et al. | |
| 8,487,444 B2 | 7/2013 | Law et al. | |
| 8,492,911 B2 | 7/2013 | Bachman et al. | |
| 8,519,543 B1 | 8/2013 | Song et al. | |
| 8,546,188 B2 | 10/2013 | Liu et al. | |
| 8,564,955 B2 | 10/2013 | Schmidt et al. | |
| 8,736,068 B2 | 5/2014 | Bartley et al. | |
| 8,754,321 B2 | 6/2014 | Schroeder et al. | |
| 8,828,860 B2 | 9/2014 | Gruber et al. | |
| 8,928,128 B2 | 1/2015 | Karikalan et al. | |
| 8,954,125 B2 | 2/2015 | Corcoles Gonzalez et al. | |
| 9,076,658 B1 | 7/2015 | Brown et al. | |
| 9,171,792 B2 | 10/2015 | Sun et al. | |
| 9,836,699 B1 | 12/2017 | Rigetti et al. | |
| 2001/0005059 A1* | 6/2001 | Koyanagi | H01L 21/8221 257/778 |
| 2001/0016383 A1 | 8/2001 | Chen et al. | |
| 2002/0094661 A1 | 7/2002 | Enquist et al. | |
| 2003/0067073 A1 | 4/2003 | Akram et al. | |
| 2004/0124538 A1 | 7/2004 | Reif et al. | |
| 2004/0188845 A1 | 9/2004 | Iguchi et al. | |
| 2004/0223380 A1 | 11/2004 | Hato | |
| 2006/0191640 A1 | 8/2006 | Johnson | |
| 2007/0087544 A1 | 4/2007 | Chang et al. | |
| 2007/0119812 A1 | 5/2007 | Kerdiles et al. | |
| 2007/0207592 A1 | 9/2007 | Lu et al. | |
| 2008/0093747 A1 | 4/2008 | Enquist et al. | |
| 2008/0122115 A1 | 5/2008 | Popa et al. | |
| 2008/0169559 A1 | 7/2008 | Yang | |
| 2008/0230916 A1 | 9/2008 | Saito et al. | |
| 2008/0290790 A1 | 11/2008 | Jin | |
| 2008/0316714 A1 | 12/2008 | Eichelberger et al. | |
| 2009/0078966 A1 | 3/2009 | Asai et al. | |
| 2009/0173936 A1 | 7/2009 | Bunyk | |
| 2009/0186446 A1 | 7/2009 | Kwon et al. | |
| 2009/0233436 A1 | 9/2009 | Kim et al. | |
| 2010/0001399 A1 | 1/2010 | Topacio | |
| 2010/0026447 A1 | 2/2010 | Keefe et al. | |
| 2010/0122762 A1 | 5/2010 | George | |
| 2010/0130016 A1 | 5/2010 | DeVilliers | |
| 2010/0148371 A1 | 6/2010 | Kaskoun et al. | |
| 2010/0171093 A1 | 7/2010 | Kabir | |
| 2011/0049675 A1 | 3/2011 | Nagai et al. | |
| 2011/0089561 A1 | 4/2011 | Kurita et al. | |
| 2011/0140271 A1 | 6/2011 | Daubenspeck et al. | |
| 2011/0189820 A1 | 8/2011 | Sasaki et al. | |
| 2011/0204505 A1 | 8/2011 | Pagaila et al. | |
| 2011/0237069 A1 | 9/2011 | Miyazaki | |
| 2011/0248396 A1 | 10/2011 | Liu et al. | |
| 2012/0032340 A1* | 2/2012 | Choi | H01L 21/561 257/774 |
| 2012/0074585 A1 | 3/2012 | Koo et al. | |
| 2012/0217642 A1 | 8/2012 | Sun et al. | |
| 2012/0228011 A1 | 9/2012 | Chang et al. | |
| 2012/0231621 A1 | 9/2012 | Chang et al. | |
| 2012/0252189 A1 | 10/2012 | Sadaka et al. | |
| 2012/0292602 A1 | 11/2012 | Guo et al. | |
| 2013/0029848 A1 | 1/2013 | Gonzalez et al. | |
| 2013/0093104 A1 | 4/2013 | Wu et al. | |
| 2013/0099235 A1 | 4/2013 | Han | |
| 2013/0147036 A1 | 6/2013 | Choi et al. | |
| 2013/0153888 A1 | 6/2013 | Inoue et al. | |
| 2013/0187265 A1 | 7/2013 | Shih et al. | |
| 2013/0244417 A1 | 9/2013 | Markunas et al. | |

(56) References Cited

U.S. PATENT DOCUMENTS

| | | |
|---|---|---|
| 2014/0001604 A1 | 1/2014 | Sadaka |
| 2014/0065771 A1 | 3/2014 | Gruber et al. |
| 2014/0113828 A1 | 4/2014 | Gilbert et al. |
| 2014/0246763 A1 | 9/2014 | Bunyk |
| 2014/0264890 A1 | 9/2014 | Breuer et al. |
| 2015/0041977 A1 | 2/2015 | Daubenspeck et al. |
| 2015/0054151 A1 | 2/2015 | Choi et al. |
| 2015/0054167 A1 | 2/2015 | Pendse |
| 2015/0054175 A1 | 2/2015 | Meinhold et al. |
| 2015/0187840 A1 | 7/2015 | Ladizinsky et al. |
| 2015/0348874 A1 | 12/2015 | Tsai et al. |
| 2016/0364653 A1 | 12/2016 | Chow et al. |
| 2017/0125383 A1 | 5/2017 | Liu |

OTHER PUBLICATIONS

U.S. Appl. No. 15/312,063, filed Nov. 17, 2016, Das, et al.
U.S. Appl. No. 14/694,540, filed Apr. 23, 2015, Das, et al.
U.S. Appl. No. 15/271,755, filed Sep. 21, 2016, Das.
U.S. Appl. No. 15/342,478, filed Nov. 3, 2016, Oliver, et al.
U.S. Appl. No. 15/342,589, filed Nov. 3, 2016, Oliver, et al.
U.S. Appl. No. 15/342,444, filed Nov. 3, 2016, Oliver, et al.
U.S. Appl. No. 15/342,517, filed Nov. 3, 2016, Oliver, et al.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
PCT Search Report of the ISA for PCT Appl. No. PCT/US2015/044651 dated Nov. 4, 2015; 3 pages.
PCT Written Opinion of the ISA for PCT Appl. No. PCT/US2015/044651 dated Nov. 4, 2015; 12 pages.
PCT Search Report of the ISA for PCT Appl. No. PCT/US2016/060263 dated Jan. 10, 2017; 3 pages.
PCT Written Opinion of the ISA for PCT Appl. No. PCT/US2016/060263 dated Jan. 10, 2017; 6 pages.
Office Action dated Mar. 24, 2017 for U.S. Appl. No. 15/303,800, 39 pages.
PCT Search Report of the ISA for PCT/US2016/060296 dated Mar. 10, 2017; 5 pages.
PCT Written Opinion of the ISA for PCT/US2016/060296 dated Mar. 10, 2017; 5 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, filed May 19, 2017; 6 pages.
Restriction Requirement dated May 16, 2017 for U.S. Appl. No. 15/327,249; 6 pages.
PCT International Preliminary Report on Patentability dated May 18, 2017 for PCT Appl. No. PCT/US2015/059181; 11 pages.
PCT International Preliminary Report on Patentability dated May 18, 2017 for PCT Appl. No. PCT/US2015/059200; 11 pages.
U.S. Appl. No. 15/684,269, filed Aug. 23, 2017, Das, et al.
U.S. Appl. No. 15/684,337, filed Aug. 23, 2017, Das, et al.
U.S. Appl. No. 15/684,393, filed Aug. 23, 2017, Das, et al.
Notice of Allowance dated Oct. 12, 2017 for U.S. Appl. No. 15/303,800; 16 pages.
Restriction Requirement for U.S. Appl. No. 15/271,755 dated Jun. 8, 2017; 6 pages.
Response to Jul. 7, 2017 Office Action for U.S. Appl. No. 15/271,755, filed Oct. 10, 2017; 33 pages.
Response to Aug. 11, 2017 Office Action for U.S. Appl. No. 15/342,444, filed Sep. 15, 2017; 20 pages.
International Preliminary Report dated Feb. 23, 2017 for PCT Application No. PCT/US2015/044608; 9 pages.
International Preliminary Report dated Feb. 23, 2017 for PCT Application No. PCT/US2015/044679; 9 pages.
International Preliminary Report dated Feb. 23, 2017 for PCT Application No. PCT/US2015/044651; 10 pages.
Burns, et al.; "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
International Search Report of the ISA for PCT Appl. No. PCT/US2016/060343 dated Jul. 18, 2017; 3 pages.
International Written Opinion of the ISA for PCT Appl. No. PCT/US2016/060343 dated Jul. 18, 2017; 12 pages.
Notice of Allowance for U.S. Appl. No. 15/327,235 dated Jun. 30, 2017; 17 pages.
Notice of Allowance for U.S. Appl. No. 14/694,540 dated Jul. 31, 2017; 9 pages.
Notice of Allowance for U.S. Appl. No. 15/312,063 dated Aug. 2, 2017; 17 pages.
Office Action dated Jul. 7, 2017 for U.S. Appl. No. 15/271,755; 26 pages.
Response to Office Action dated Mar. 3, 2017 for U.S. Appl. No. 14/694,540, filed Jun. 1, 2017; 24 pages.
Response to Office Action dated Mar. 24, 2017 for U.S. Appl. No. 15/303,800, filed Jun. 26, 2017; 22 pages.
Response to Restriction Requirement dated May 16, 2017 for U.S. Appl. No. 15/327,249, filed Jun. 27, 2017; 1 page.
Response to Restriction Requirement dated Jun. 8, 2017 for U.S. Appl. No. 15/271,755, filed Jun. 19, 2017; 1 page.
Office Action dated Oct. 20, 2017 for U.S. Appl. No. 15/327,249; 30 pages.
Final Office Action dated Dec. 6, 2017 for U.S. Appl. No. 15/342,444; 18 pages.
Final Office Action dated Dec. 20 2017 for U.S. Appl. No. 15/271,755; 25 pages.
Restriction Requirement dated Oct. 23, 2017 for U.S. Appl. No. 15/342,517; 6 pages.
Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
Tarniowy, et al.; "The Effect of Thermal Treatment on the Structure, Optical and Electrical Properties of Amorphous Titanium Nitride Thin Films;" Thin Solid Films 311; 1997; 8 pages.
PCT Search Report of the ISA for PCT/US2016/052824 dated Feb. 3, 2017; 6 pages.
PCT Written Opinion of the ISA for PCT/US2016/052824 dated Feb. 3, 2017; 6 pages.
PCT Search Report of the ISA for PCT/US2016/043266 dated Dec. 5, 2016; 5 pages.
PCT Written Opinion of the ISA for PCT/US2016/043266 dated Dec. 5, 2016; 9 pages.
Office Action dated Mar. 3, 2017 for U.S. Appl. No. 14/694,540; dated 16 pages.
Office Action dated Aug. 11, 2017 for U.S. Appl. No. 15/342,444; 22 pages.
U.S. Appl. No. 15/745,914, filed Jan. 18, 2018, Oliver, et al.
PCT International Preliminary Report on Patentability dated Feb. 1, 2018 for PCT Appl. No. PCT/US2016/043266; 11 pages.
Response to Final Office Action dated Dec. 6, 2017 for U.S. Appl. No. 15/342,444; Response filed Mar. 2, 2018; 16 pages.

(56) References Cited

OTHER PUBLICATIONS

Response to Restriction Requirement dated Oct. 23, 2017 for U.S. Appl. No. 15/342,517, filed Dec. 22, 2017; 1 pages.
Restriction Requirement dated Jan. 3, 2018 for U.S. Appl. No. 15/342,478; 6 pages.
Response to Restriction Requirement dated Jan. 3, 2018 for U.S. Appl. No. 15/342,478, filed Mar. 2, 2018; 6 pages.
Advisory Action dated Mar. 20, 2018 for U.S. Appl. No. 15/342,444; 3 pages.
U.S. Non-Final Office Action dated Mar. 21, 2018 for U.S. Appl. No. 15/342,589; 25 pages.
Response to Non-Final Office Action dated Apr. 23, 2018 for U.S. Appl. No. 15/342,478, filed Aug. 23, 2018; 18 Pages.
Notice of Allowance dated Jul. 9, 2018 for U.S. Appl. No. 15/327,249; 15 Pages.
Notice of Allowance dated Jul. 18, 2018 for U.S. Appl. No. 15/342,444; 11 Pages.
Office Action dated Aug. 9, 2018 for U.S. Appl. No. 15/271,755; 29 Pages.
Response to Office Action dated Apr. 19, 2018 for U.S. Appl. No. 15/342,517, filed Jul. 17, 2018; 14 Pages.
U.S. Non-Final Office Action dated Apr. 23, 2018 for U.S. Appl. No. 15/342,478; 11 Pages.
U.S. Non-Final Office Action dated Apr. 19, 2018 for U.S. Appl. No. 15/342,517; 8 Pages.
Response to U.S. Non-Final Office Action dated Oct. 20, 2017 for U.S. Appl. No. 15/327,249; Response filed Apr. 19, 2018; 19 Pages.
Response to U.S. Final Office Action dated Dec. 20, 2017 for U.S. Appl. No. 15/271,755; Response filed Apr. 23, 2018; 23 Pages.
Response to U.S. Final Office Action dated Dec. 6, 2017 for U.S. Appl. No. 15/342,444; Response filed May 4, 2018; 18 Pages.
U.S. Non-Final Office Action dated May 11, 2018 for U.S. Appl. No. 15/684,393; 15 Pages.
PCT International Preliminary Report dated May 17, 2018 for International Application No. PCT/US2016/060296; 7 Pages.
PCT International Preliminary Report dated May 17, 2018 for International Application No. PCT/US2016/060343; 9 Pages.
PCT International Preliminary Report dated May 17, 2018 for International Application No. PCT/US2016/060263; 8 Pages.
PCT International Preliminary Report dated May 17, 2018 for International Application No. PCT/US2016/060309; 8 Pages.
Final Office Action dated Oct. 23, 2018 for U.S. Appl. No. 15/342,478; 21 pages.
Notice of Allowance dated Oct. 3, 2018 for U.S. Appl. No. 15/342,517; 13 pages.
Notice of Allowance dated Nov. 8, 2018 for U.S. Appl. No. 15/684,393; 8 pages.
Restriction Requirement dated Oct. 11, 2018 for U.S. Appl. No. 15/684,337; 8 pages.
Response to Restriction Requirement dated Oct. 11, 2018 for U.S. Appl. No. 15/684,337, filed Nov. 9, 2018; 10 pages.
Response to Office Action dated Aug. 9, 2018 for U.S. Appl. No. 15/271,755, filed Sep. 28, 2018; 16 pages.
Response to Office Action filed on Jan. 23, 2019 for U.S. Appl. No. 15/342,478; 9 pages.
Non-Final Office Action dated Feb. 1, 2019 for U.S. Appl. No. 15/684,337; 10 Pages.
Office Action dated Jan. 8, 2019 for U.S. Appl. No. 15/684,269; 23 pages.

* cited by examiner

SEMICONDUCTOR STRUCTURES FOR ASSEMBLY IN MULTI-LAYER SEMICONDUCTOR DEVICES INCLUDING AT LEAST ONE SEMICONDUCTOR STRUCTURE

CROSS REFERENCE TO RELATED APPLICATIONS

This application is a U.S. National Stage of PCT application PCT/US2015/044679 filed in the English language on Aug. 11, 2015, and entitled "Semiconductor Structures For Assembly In Multi-Layer Semiconductor Devices Including At Least One Semiconductor Structure," which claims the benefit under 35 U.S.C. § 119 of provisional application number 62,035,713 filed Aug. 11, 2014, which application is hereby incorporated herein by reference.

STATEMENT REGARDING FEDERALLY SPONSORED RESEARCH

This invention was made with government support under Contract No. FA8721-05-C-0002 awarded by the U.S. Air Force. The government has certain rights in the invention.

FIELD

This disclosure relates generally to semiconductor structures, and more particularly, to semiconductor structures for assembly in multi-layer semiconductor devices including at least one semiconductor structure.

BACKGROUND

As is known in the art, there is trend toward miniaturization of electronic products such as mobile phones, tablets, digital cameras, and the like. Consequently, there has been a trend in semiconductor device manufacturing towards smaller and more densely packed semiconductor structures. This has resulted in a demand for semiconductor packages which are relatively low loss, lightweight structures and which support increased electronic capabilities (e.g., increased density, mobility and extended operational life) in miniaturized electronic products demanded by both military and commercial customers alike.

The foregoing trend and demand, for example, drives a need for multi-layer semiconductor structures (e.g., three dimensional (3D) integrated circuits (ICs)), semiconductor structures in which a number of individual semiconductor structures are both mechanically and electrically coupled. The foregoing trend and demand also drives a need for compact multi-layer semiconductor devices including at least one semiconductor structure (e.g., a multi-layer semiconductor structure).

SUMMARY

Described herein are concepts, systems, circuits and techniques related to semiconductor structures suitable for assembly in multi-layer semiconductor devices including at least one semiconductor structure. The present disclosure further describes circuits and techniques for fabricating multi-layer semiconductor devices including at least one semiconductor structure, the at least semiconductor structure providing for a multi-layer semiconductor device having a reduced height (e.g., distance between first and second opposing surfaces of the multi-layer semiconductor devices) in comparison to conventional semiconductor devices.

The present disclosure additionally describes circuits and techniques for fabricating three-dimensional (3D) integrated circuit structures and techniques for integrating 3D IC structures into multi-layer semiconductor devices. The foregoing offers significant promise to relax the power, performance, and computational tradeoffs inherent in conventional planar circuit topologies. The building blocks of the 3D integration may include fully depleted SOI (FDSOI) circuit fabrication, precision wafer-wafer alignment, low-temperature wafer-wafer oxide bonding, and electrical connection of the circuit structures with dense vertical interconnections. When compared to conventional flip-chip technology, the wafer-scale 3D integration disclosed herein offers higher density vertical interconnections and reduced system power.

In one aspect of the concepts described herein, a multi-layer semiconductor device includes a first semiconductor structure having first and second opposing surfaces and a plurality of electrical connections extending between select portions of the first and second surfaces. The multi-layer semiconductor device also includes a second semiconductor structure having first and second opposing surfaces. The second semiconductor structure includes a first section having first and second opposing surfaces and a plurality of electrical connections extending between select portions of the first and second surfaces. The first surface of the first section corresponds to the first surface of the second semiconductor structure.

The second semiconductor structure also includes a second section having first and second opposing surfaces, with the first surface of the second section disposed over and coupled to the second surface of the first section. The second section includes a device layer having first and second opposing surfaces and a plurality of electrical connections extending between the first and second surfaces. The second surface of the device layer corresponds to the second surface of the second section. The second section also includes an insulating layer having first and second opposing surfaces. The first surface of the insulating layer corresponds to the first surface of the second section.

The second semiconductor structure additionally includes one or more conductive structures extending between select ones of the electrical connections in the first section, select ones of the electrical connections in the device layer of the second section, and select portions on or beneath the second surface of the second semiconductor structure. The second semiconductor structure further includes one or more interconnect pads having first and second opposing surfaces and one or more sides. The first surface of each one of the interconnect pads is disposed over or beneath select portions of at least the second surface of said second semiconductor structure and select ones of the interconnect pads are electrically coupled to select ones of the conductive structures.

The multi-layer semiconductor device further includes one or more interconnect structures disposed between and coupled to select portions of second surfaces of each of the first and second semiconductor structures. At least one of the interconnect structures is electrically coupled to the second surface of a select one of the interconnect pads of said second semiconductor structure to form one or more electrical connection between said first and second semiconductor structures.

The multi-layer semiconductor device may include one or more of the following features individually or in combination with other features. The first semiconductor structure may be a multi-chip module (MCM). The interconnect structures may be electrically coupled to select ones of the electrical connections in the first semiconductor structure and form a micro bump assembly on the second surface of the first semiconductor structure. The first semiconductor structure may include one or more interconnect pads having first and second opposing surfaces and one or more sides. The first surface of first select ones of the interconnect pads is disposed over or beneath select portions of at least the second surface of the first semiconductor structure and select ones of the first select ones of the interconnect pads are electrically coupled to select ones of the electrical connections. The at least one interconnect structure of the multi-layer semiconductor device is further electrically coupled to a first one of the select ones of the interconnect pads of the first semiconductor structure to form a first one of the electrical connections between the first semiconductor structure and the second semiconductor structure.

The multi-layer semiconductor device may also include one or more of the following features individually or in combination with other features. The second semiconductor structure may include a third section having first and second opposing surfaces. The first surface of the third section is disposed over and coupled to the second surface of the second section. The third section includes a device layer having first and second opposing surfaces and a plurality of electrical connections extending between the first and second surfaces. The second surface of the device layer corresponds to the second surface of the third section. The third section also includes an insulating layer having first and second opposing surfaces. The first surface of the insulating layer corresponds to the first surface of the third section. At least one of the conductive structures in the second semiconductor structure extends between select ones of the electrical connections in the device layer of the second section, select ones of the electrical connections in the device layer of the third section, and first surfaces of select ones of the interconnect pads of the second semiconductor structure.

The multi-layer semiconductor device may additionally include one or more of the following features individually or in combination with other features. A predetermined distance of between about six micrometers (μm) and about eight μm exists between the first and second surfaces of each of the first, second and third sections of the second semiconductor structure. The predetermined distance corresponds to a height of the first, second and third sections of the second semiconductor structure. At least the second and third sections of the second semiconductor structure are fabricated using Silicon-On-Insulator (SOI) fabrication techniques. The first section of the second semiconductor structure is fabricated using either SOI or bulk complementary metal-oxide semiconductor (CMOS) fabrication techniques. At least one of the one or more conductive structures extending between select ones of the electrical connections in the first section and select ones of the electrical connections in the device layer of the second section is provided as a through insulator via (TIV) or a through oxide via (TOV) conductive structure. The interconnect structures may be provided from one or more fusible conductive materials.

The multi-layer semiconductor device may further include one or more of the following features individually or in combination with other features. The interconnect structures may have first and second opposing portions. A predetermined distance of between about five micrometers (μm) and about one-hundred μm exists between the first and second portions of the interconnect structures. The predetermined distance corresponds to a height of the interconnect structures. The multi-layer semiconductor device may include a third semiconductor structure having first and second opposing surfaces. The multi-layer semiconductor device may also include one or more interconnect structures disposed between and coupled to select portions of the first surface of the first semiconductor structure and select portions of the second surface of the third semiconductor structure. The third semiconductor structure may be a printed circuit board (PCB) or a substrate.

The multi-layer semiconductor device may also include one or more of the following features individually or in combination with other features. The multi-layer semiconductor device may include one or more wire bond structures. At least one of the wire bond structures has a first portion electrically coupled to the second surface of the third semiconductor structure and a second opposing portion electrically coupled to the second surface of the first semiconductor structure to form one or more electrical connections between the third and first semiconductor structures. The first semiconductor structure may be an interposer module.

In one aspect of the concepts described herein, a method for fabricating a multi-layer semiconductor device includes providing a first semiconductor structure having first and second opposing surfaces and one or more electrical connections extending between the first and second surfaces. The method also includes providing a second semiconductor structure having first and second opposing surfaces. The second semiconductor structure includes a first section having first and second opposing surfaces and a plurality of electrical connections extending between select portions of the first and second surfaces. The first surface of the first section corresponds to the first surface of the second semiconductor structure.

The second semiconductor structure also includes a second section having first and second opposing surfaces. The first surface of the second section is disposed over and coupled to the second surface of the first section. The second section includes a device layer having first and second opposing surfaces and a plurality of electrical connections extending between the first and second surfaces. The second surface of the device layer corresponds to the second surface of the second section. The second section also includes an insulating layer having first and second opposing surfaces. The first surface of the insulating layer corresponds to the first surface of the second section.

The second semiconductor structure additionally includes one or more conductive structures extending between select ones of the electrical connections in the first section, select ones of the electrical connections in the device layer of the second section, and select portions on or beneath the second surface of the second semiconductor structure. The second semiconductor structure further includes one or more interconnect pads having first and second opposing surfaces and one or more sides. The first surface of each one of the interconnect pads is disposed over or beneath select portions of at least the second surface of the second semiconductor structure and select ones of the interconnect pads are electrically coupled to select ones of the one or more conductive structures.

The method also includes providing one or more interconnect structures, each of the interconnect structures having first and second opposing portions. The method additionally includes coupling the first portion of first select ones of the interconnect structures to select portions of the second surface of the first semiconductor structure. The method further includes coupling the second portion of the first select ones of the interconnect structures to select portions of the second surface of the second semiconductor structure to form one or more electrical connections between the first and second semiconductor structures.

The method may include one or more of the following features either individually or in combination with other features. Providing the first semiconductor structure may include providing a multi-chip module (MCM) having first and second opposing surfaces and a plurality of electrical connections extending between select portions of the first and second surfaces. The MCM may correspond to the first semiconductor structure. Coupling the first portion of first select ones of the interconnect structures to select portions of the second surface of the first semiconductor structure may include coupling the first portion of first select ones of the interconnect structures to select ones of the electrical connections in the first semiconductor structure. Coupling the first portion of the first select ones may also include forming a micro bump assembly on the second surface of the first semiconductor structure.

The method may also include one or more of the following features either individually or in combination with other features. Providing a third semiconductor structure having first and second opposing surfaces. Coupling the first portion of second select ones of the interconnect structures to select portions of the second surface of the third semiconductor structure. Coupling the second portion of the second select ones of the interconnect structures to select portions of the first surface of the first semiconductor structure to form one or more electrical connections between the first and third semiconductor structures.

BRIEF DESCRIPTION OF THE DRAWINGS

Features and advantages of the concepts, systems, circuits and techniques disclosed herein will be apparent from the following description of the embodiments taken in conjunction with the accompanying drawings in which.

DETAILED DESCRIPTION

Figure 1:
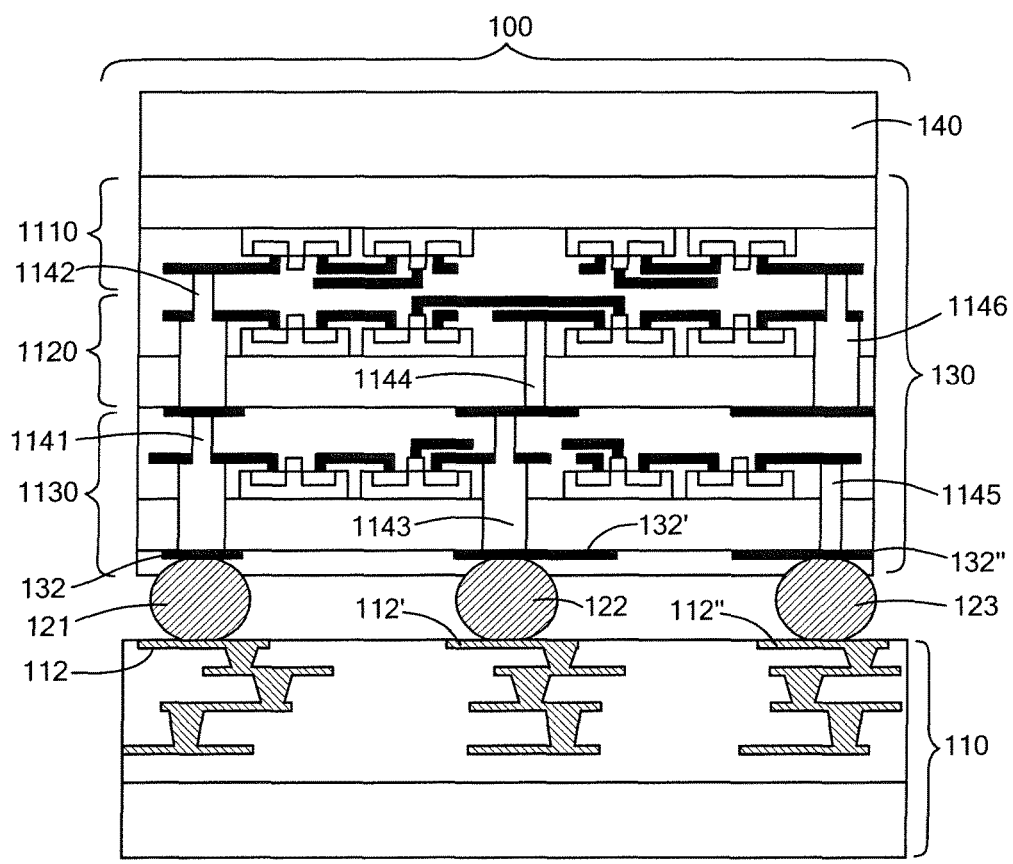
FIG. 1 is a block diagram of an example multi-layer semiconductor device.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or a reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "electronic device" is used to describe an integrated circuit (IC) device (e.g., a semiconductor chip).

As used herein, the term "interposer" is used to describe an interconnect structure capable of electrically coupling two or more semiconductor structures together.

As used herein, the term "module" is used to describe an electrical component having a substrate (e.g., a silicon substrate or printed circuit board (PCB)) on which at least one semiconductor device is disposed. The module may include a plurality of conductive leads adapted for coupling the module to electrical circuitry and/or electrical components located externally of the module. One known example of such a module is a Multi-Chip Module (MCM), such modules coming in a variety of shapes and forms. These can range from pre-packaged chips on a PCB (to mimic the package footprint of an existing chip package) to fully custom chip packages integrating many chips on a High Density Interconnection (HDI) substrate.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit or digital circuit.

As used herein, the term "substrate" is used to describe any structure upon which an integrated circuit or semiconductor device can be disposed or upon which semiconductor materials can be deposited and/or into which semiconductor materials can be implanted and diffused to form a semiconductor structure or device, for example. In some embodiments, the substrate may be provided as a P-type substrate (i.e., a substrate) having a particular range of concentrations of P-type atoms (i.e., ions). In other embodiments an N-type substrate may be used (i.e., a substrate having a particular range of concentration of N-type atoms).

The substrate may, for example, be provided from a semiconductor material, an insulator material or even a conductor material. For example, the substrate may be provided from silicon, alumina, glass or any other semiconductor material. Further, the substrate can include a number of metal-oxide-silicon (MOS) devices, complementary-MOS (CMOS) devices, or a number of active or passive integrated circuit semiconductor devices.

As used herein, the term "wafer-wafer bonding" is used to describe a bonding process in 3-D integrated circuit integration in which: (1) a room-temperature bond is sufficiently strong to prevent wafer slippage between the wafer alignment and wafer bonding processes, since the alignment and an about 150-300 degree Celsius heat treatment takes place in two separate instruments; (2) bonding temperatures do not exceed about 500 degrees C., the upper limit of an aluminum-based interconnect; (3) the bond must be sufficiently strong to withstand the 3-D-fabrication process.

Complementary metal-oxide semiconductor (CMOS) wafers to be bonded are coated with about 1500 nm of a low-temperature oxide (LTO) deposited by low pressure chemical vapor deposition (LPCVD) at a temperature of about 430 degrees C. About 1000 nm of the oxide is removed by chemical mechanical polishing (CMP) to planarize and smooth the surfaces to a roughness of about angstrom level surface roughness. The wafers may be immersed in H2O2 at a temperate of about 80 degrees C. for 10 minutes to remove any organic contaminants and to activate the surfaces with a high density of hydroxyl groups, after which the wafers are rinsed and spun dry in nitrogen in a standard rinse/dryer.

The wafers may be precision aligned to sub-micron accuracy using infrared cameras, for example, to look directly through a top tier substrate (e.g., a first section) and bonded by initiating contact at predetermined point (e.g., a center point) of the top tier substrate. When the surfaces are brought into contact, weak (~0.45 eV) hydrogen bonds may be created at a bonding interface (Si—OH:HO—Si). The bonding interface may propagate radially within about 2-5 seconds to the edge of a wafer pair, and after 30 seconds, the wafer pair can be removed from the aligner without disturbing the bond and wafer alignment. The bond strength is increased by a thermal cycle that creates covalent bonds at the interface from the reaction Si—OH:HO—Si→Si—O—Si+H2O, with the Si—O bond having a bond energy of 4.5 eV. Optimal thermal cycle parameters for this particular bonding technique were determined by measuring bond strengths in the temperature range about 150 degrees C. to about 500 degrees C.

Referring now to FIG. 1, an example multi-layer semiconductor device 100 in accordance with the concepts, systems, circuits, and techniques sought to be protected herein is shown. The multi-layer semiconductor device 100, which illustrates three-dimensional (3D) integrated circuit (IC) assembly capabilities with a semiconductor structure having a different pitch, includes a first semiconductor structure 110, a second semiconductor structure 130, and a plurality of interconnect structures (here, interconnect structures 121, 122, 123) for electrically and mechanically coupling the second semiconductor structure 130 to the first semiconductor structure 110.

First semiconductor structure 110 (e.g., a wafer or die), which is provided as a multi-chip module (MCM) assembly (e.g., Silicon based MCM, ceramic based MCM, or organic MCM) in the illustrated embodiment, has first and second opposing surfaces and a plurality of electrical connections (e.g., vias) extending between select portions of the first and second surfaces. First semiconductor structure 110 also includes a plurality of interconnect pads (here, interconnect pads 112, 112', and 112"), each having first and second opposing surfaces and one or more sides. Each of interconnect pads 112, 112', and 112" (e.g., solderable metal pads) has a first surface disposed over or beneath select portions of the second surface of first semiconductor structure 110. Additionally, each of interconnect pads 112, 112', and 112" is electrically coupled to select ones (here, first, second and third select ones, respectively) of the electrical connections in first semiconductor structure 110.

Second semiconductor structure 130 (e.g., a wafer or die), which is provided as a multi-layer semiconductor structure (e.g., a three-dimensional (3D) integrated circuit (IC)) in the illustrated embodiment, has first and second opposing surfaces and includes a plurality of sections (e.g., functional sections), here three sections (and three device layers).

Second semiconductor structure 130 may be connected to first section through via-last techniques or via-first, for example.

A first one of the sections (e.g., device layer or a tier-1 functional section) 1110, which is also sometimes referred to herein as a "first section" 1110, has first and second opposing surfaces, the first surface corresponding to the first surface of second semiconductor structure 130. The first section 1110 also includes a plurality of electrical connections (e.g., vias) extending between select portions of the first and second surfaces of the first section 1110. The electrical connections may, for example, be made by drilling holes through the first section 1110 in appropriate locations and plating the inside of the holes with a conducting material (e.g., copper or Ti/TiN liner with tungsten (W) fill). The first section 1110 may be fabricated using either Silicon-On-Insulator (SOI) or bulk complementary metal-oxide semiconductor (CMOS) fabrication techniques, for example.

A second one of the sections (e.g., a tier-2 functional section) 1120, which is also sometimes referred to herein as a "second section" 1120, has first and second opposing surfaces. The second section 1120, which may be fabricated using SOI fabrication techniques, for example, includes a device layer having first and second opposing surfaces and a plurality of electrical connections extending between the first and second surfaces. The second surface of the device layer, which includes one or more circuit components, devices and modules (e.g., resistors, capacitors, transistors, inductors, integrated circuits) (not shown), for example, corresponds to the second surface of the second section 1120. The second section 1120 also includes an insulating layer which is provided from an electrically-insulating material (e.g., Silicon oxide $SiO_x$), the insulating layer having first and second surfaces. The first surface of the insulating layer, which corresponds to the first surface of the second section 1120, is disposed over and coupled to the second surface of the first section 1110. First and second sections 1110, 1120 are coupled together using wafer-to-wafer bonding. Additionally, the third section 1130 is coupled to the first and second section 1110, 1120 using wafer-wafer bonding.

A third one of the sections (i.e., a tier-3 functional section) 1130, which is also sometimes referred to herein as a "third section" 1130 and is similar to second section 1120 in the example embodiment shown, has first and second opposing surfaces. The first surface of the third section 1130 is disposed over and coupled to the second surface of the second section 1120, and the second surface of the third section 1130 corresponds to the second surface of second semiconductor structure 130.

The third section 1130 includes a device layer having first and second opposing surfaces and a plurality of electrical connections extending between the first and second surfaces. The second surface of the device layer corresponds to the second surface of the third section 1130. The third section 1130 also includes an insulating layer having first and second opposing surfaces. The first surface of the insulating layer corresponds to the first surface of the third section 1130. In one embodiment, the third section 1130 is fabricated using through oxide vias (TOV) and/or through insulator vias (TIV). The third section 1130 has bonding layer resistance only whereas conventional through silicon via (TSV) based systems have additional TSV resistance as well as bonding layer resistance. Our method for fabricating third section 1130, for example, eliminates TSV (no additional interconnect length) when connecting two chips together. It's a direct attached process and eliminates signal path delay and loss associated with the TSV. Such effects are more prominent with increasing number of chip (or section) stacking.

The second semiconductor structure 130 also includes a plurality of conductive structures (here, conductive structures 1141, 1142, 1143, 1144, 1145, 1146) extending between select ones of the electrical connections in the first section 1110, select ones of the electrical connections in the device layer of the second section 1120, and/or select ones of the electrical connections in the device layer of the third section 1130. In some embodiments, at least one of conductive structures 1141, 1142, 1143, 1144, 1145, 1146 is provided as a through insulator via (TIV) conductive structure. Example conductive materials for conductive structures 1141, 1142, 1143, 1144, 1145, 1146 (e.g., micro vias and/or sub-micron vias) include, but are not limited to: titanium, titanium-nitride, tungsten and/or other suitable electrically conductive materials.

The second semiconductor structure 130 additionally includes a plurality of interconnect pads (here, interconnect pads 132, 132', and 132"), each having first and second opposing surfaces and one or more sides. Each of interconnect pads 132, 132', and 132" (e.g., solderable metal pads) has a first surface disposed over or beneath (e.g., attached or otherwise coupled to) select portions of the second surface of second semiconductor structure 130 using techniques well known to those of ordinary skill in the art.

Additionally, each of interconnect pads 132, 132', and 132" is electrically coupled to select ones (here, first, second and third select ones, respectively) of the conductive structures (e.g., 1141) in second semiconductor structure 130. The electrical coupling may, for example, occur through bond wires or via contacts spaced between the first surface of the interconnect pads 132, 132', and 132" and the conductive structures (e.g., 1141) in a region below the interconnect pads 132, 132', and 132". In one embodiment, at least one of the conductive structures 1141, 1142, 1143, 1144, 1145, 1146 extends between and/or is electrically coupled to select ones of the electrical connections in the device layer of the second section 1120, select ones of the electrical connections in the device layer of the third section 1130, and the first surface of one or more of interconnect pads 132, 132', and 132".

Multi-layer semiconductor device 100 further includes an optional support or "handle" structure (e.g., a handle substrate) 140 having first and second opposing surfaces. The handle structure 140, which may be provided from Silicon (Si), Silicon carbide (SiC) and/or Sapphire as a few examples, may be used for coupling multi-layer semiconductor device 100 (or second semiconductor structure 130) to machinery for aligning and coupling multi-layer semiconductor device 100 (or second semiconductor structure 130) to other semiconductor structures, for example. In the example embodiment shown, the second surface of the handle structure 140 is disposed over and coupled to the first surface of second semiconductor structure 130. The handle structure 140 may be provided as part of or separate from the second semiconductor structure 130.

In one embodiment, second semiconductor structure 130 is fabricated by transferring and interconnecting the functional sections (e.g., 1110, 1120, 1130) of wafers fabricated on about 200-mm SOI substrates to a base wafer. Second section 1120 may be transferred to first section 1110 (e.g., a base tier), after face-to-face infrared alignment, oxide-oxide bonding at about 150-300 degrees Celsius, and a wet etch of the handle silicon (e.g., 140) to expose the buried oxide (BOX) of second section 1120. The BOX is used as an etch stop for the silicon etch to produce a uniformly thin active layer and is an essential step in the 3-D assembly technology. For this reason, all circuits to be transferred are fabricated with SOI substrates.

The handle silicon (e.g., 140) of a transferred tier (or section) is removed by grinding the handle silicon to a thickness of about 70 μm followed by a silicon etch in a 10% tetramethyl ammonium hydroxide (TMAH) solution at about 90 degrees C. Since the ratio of silicon to BOX etch rates in TMAH is 1000:1, the handle silicon is removed without attacking the BOX and without introducing a thickness variation in the transferred tier, a factor that is essential when forming the vertical connections, or 3-D vias. In both etches, the edge is protected to ensure that the wafer (i.e., the wafer containing the sections) can be handled by cassette-to-cassette equipment and that the silicon removal process does not attack the oxide-oxide bond. Although buried oxide may be preferred as an etch stop for the silicon in some embodiments, in other embodiments other insulating materials capable of stop selective Si etching can be used instead of buried oxide.

Conductive structures 1141, 1142, 1143, 1144, 1145, 1146, which may be provided as 3-D vias, for example, may be patterned and etched through the BOX and deposited oxides to expose metal contacts in the sections. 3-D vias are located in the isolation (field) region between transistors. Additionally, 3-D vias may be defined by the resist opening which is closely matching with a donut shaped metal opening which is within and/or at an end of a section and etched through existing dielectric regions in the field such that lining the vias with a deposited dielectric is not required to achieve insulation between the vertical connections. 3D via etching may require multistep etching processes, including dry and/or wet oxide etching, metal etching and oxide etching. Multistep wet etching can create lateral etching to the oxides which creates 3D via to unique shape. We use titanium (~10 nm) and MOCVD TiN (~5 nm) liner and tungsten plugs for 3D via interconnects. MoCVD or CVD $TiN_X$ (X≤5.1) preferred here for better conformal coating. Metal fill 3-D vias were used chemical mechanical polishing for planarization.

The metal contact in an upper tier (e.g., third section 1130) of semiconductor structure 130 may be an annulus with a 1.5-μm opening that may also function as a self-aligned hard mask during the plasma etch of the oxide beneath it to reach a metal land in a lower tier (e.g., first section 1110). In order to fully land the 3-D via, the size of the metal pad, and thus the pitch of the vertical interconnect, may be made proportional to twice the wafer-wafer misalignment. In general, a multi-metal layer pad is deposited on top of a metal fill via. Ti (10 nm)-Al/Cu (170 nm)-Ti (10 nm)-25 nm $TiN_X$ (X≤1) based metal pads may be preferred here for better conductivity. Additionally, PVD $TiN_X$ (X≤1) may be used for better electrical conductivity. For example, 75 nm PVD or IMP PVD TiN may result in higher conductivity and better critical temperature $T_C$ than MOCVD TiN. MOCVD may also require multiple passes to achieve thicker layer.

Second semiconductor structure 130 is electrically coupled to first semiconductor structure 110 (i.e., to form multi-layer semiconductor device 100) through interconnect structures 121, 122, 123 (e.g., solder balls, self-aligned contact pads) which are disposed between the second surfaces of interconnect pads 132, 132', 132" of second semiconductor structure 130 and interconnect pads 112, 112', 112" of first semiconductor structure 110, respectively. Interconnect structures 121, 122, 123 may, for example, form a ball grid array (BGA) type package on the second surface of second semiconductor structure 130 or the second surface of first semiconductor structure 110. Those of ordinary skill in the art will understand how to select the size, shape and electrically conductive materials of interconnect structures 121, 122, 123 for a particular application (e.g., based on pitch and assembly risk sites). Example electrically conductive materials for interconnect structures 121, 122, 123 include, but are not limited to: copper, aluminum, gold/ nickel/Cu, gold/platinum/Titanium/Al, conductive fusible metals, and/or other suitable electrically conductive materials.

As one example, interconnect structures 121,122,123 are formed using solder ball connectors and conventional "C-4" solder attach technology. "C-4" stands for "controlled collapse chip connection" in which solder balls connect contact sites on the chip underside to conductors on the upper surface of the circuitized substrate.

Direct copper-to-copper (i.e., metal-to-metal) bonding of interconnect structures 121,122,123, for example, which may enable fast placement of semiconductor structures (e.g., 3D IC structures) may require a good planarity and excellent surface quality especially in terms of both particulate and metallic contamination. The low roughness of the copper pillars and pad as well as the topology between the copper and oxide areas may be critical for obtaining a good bond at low force and room temperature. is the bonding may be performed at low force and room temperature which is advantageous for high density interconnect applications requiring high accuracy placement. To ensure void-free bonding, the die placement must be carried out in a particle-free environment. This kind of bonding produce die-to-wafer bonder with submicron placement accuracy with stacking capability compatible with "face-to-face" or "face-to-back" alignment. A 2-Step approach with individual placement followed by a global bonding sequence is preferred in some embodiments. Cu surfaces may be bonded together using either die-to-die (D2D), die-to-wafer (D2 W), or wafer-to-wafer (W2 W) bonding, for example. Oxides present at the Cu surfaces may be provided from thermo-compression bonding, for example.

To achieve high-quality and reliable bonding, a controlled environment preventing oxide formation during the bonding sequence may be required in some embodiments. It may also be necessary to remove the oxide that might be present before bonding (e.g., through mechanical scrubbing or in-situ chemical oxide removal). It is possible to make interconnect structures 121,122,123 using electrically conductive adhesive (ECA) in one side of a pad to which the conductive structures are to be coupled to and a solder paste or solder ball attached to other side of the pad. Cure or reflow may bond ECA with solder to create interconnect structures 121,122,123. It is further possible to use an ECA containing flux component that re-melts reflowed, washed solder during ECA curing and produces a better ECA-solder connection. It is also possible to use solder paste with no clean flux which reacts with the ECA during a reflow and curing process. No clean flux in the solder paste can be used as curing agent for the ECA. At least some of the metal particles (Cu, silver, gold, etc.) of the ECA can react with the solder to produce an intermetallic/solid solution and thus reduce solder-ECA interface resistance at the interconnect.

In one embodiment, interconnect structures 121, 122, 123 have first and second opposing portions, with a predetermined distance of between about five micrometers (μm) and about one hundred μm existing between the first and second portions (e.g., with the predetermined distance selected based on the MCM). For Si MCM, for example, the pitch can be as low as 5 µm in some embodiment. For interposer, a larger pitch may be desirable. Additionally, in one embodiment, interconnect structures 121, 122, 123 provide for a pitch of between about ten µm and about two-hundred µm (e.g., with the pitch is related to the MCM or interposer).

In some embodiments, the insulating layer of at least the second section 1120 of second semiconductor structure 130 is provided from an oxide material including at least one of silicon dioxide ($SiO_2$) and chemically treated silicon oxide ($SiO_x$). The $SiO_x$ may be chemically treated after single or multiple deposition processes. Additionally, in some embodiments, at least one of the conductive structures (e.g., 1142, 1144, 1146) extending between select ones of the electrical connections in the first section 1110 and select ones of the electrical connections in the device layer of the second section 1120 is provided as a through insulator via (TIV) conductive structure or a through oxide via (TOV) conductive structure.

Additionally, in some embodiments, a predetermined distance of between about six micrometers (µm) and about eight µm exists between the first and second surfaces of each of the first, second and third sections of the second semiconductor structure 130, the predetermined distance corresponding to a height of the first, second and third sections of the second semiconductor structure 130.

Further, in some embodiments, the multi-layer semiconductor device 100 discussed above and the multi-layer semiconductor devices of FIGS. 2-8 discussed below may include or be provided as part of a system such as a telecommunication system (e.g., in a handset or base station) or an information technology system or a circuit such as a filter circuit (e.g., a tunable radio-frequency (RF) filter circuit). In implementing a filter circuit in a multi-layer semiconductor device (e.g., multi-layer semiconductor device 100) including at least one semiconductor structure having a plurality of sections (e.g., second semiconductor structure 130), for example, a first one of the sections may include a first resonator circuit, a second one of the sections may include a second resonator circuit, a third one of the sections may include a third resonator circuit and so on. The resonator circuits may, for example, be combinable to provide a filter circuit having a multi-octave response characteristic. The filter circuit of the multi-layer semiconductor device may be integrated into a communications device.

Additional aspects of the concepts, systems, circuits and techniques sought to be protected herein, with particular emphasis on the semiconductor structures of the multi-layer semiconductor devices, are described in conjunction with the figures below.

Figure 2:
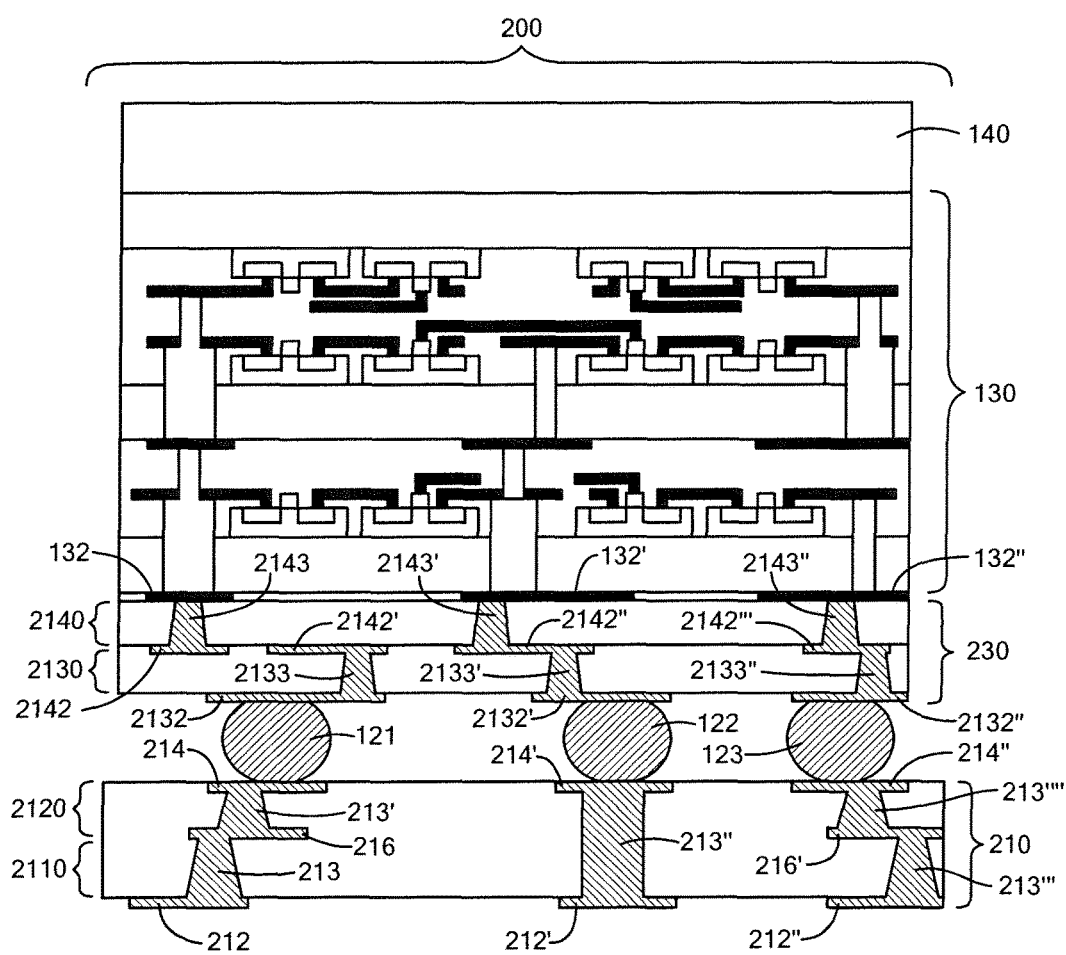
FIG. 2 is a block diagram of another example multi-layer semiconductor device.

Referring now to FIG. 2, in which like elements of FIG. 1 are provided having like reference designations, an example multi-layer semiconductor device 200 includes a first semiconductor structure 210, a second semiconductor structure 230, the semiconductor structure 130 (here, a third semiconductor structure 130), and interconnect structures 121, 122, 123.

First semiconductor structure 210 (e.g., a multi-layer printed circuit board (PCB)) has first and second opposing surfaces and includes a plurality of sections (here, first and second sections 2110, 2120). The first section (e.g., a first layer) 2110 has first and second opposing surfaces, with the first surface of the first section 2110 corresponding to the first surface of the first semiconductor structure 210. Additionally, the second section (e.g., a second layer) 2120 has first and second opposing surfaces, with the first surface of the second section 2120 disposed over and coupled to the second surface of the first section 2110. The second surface of the second section 2120 corresponds to the second surface of the first semiconductor structure 210 in the illustrated embodiment.

The first semiconductor structure 210 also includes a plurality of interconnect pads (here, interconnect pads 212, 212', 212", 214, 214', 214", 216, 216'), each having first and second opposing surfaces and one or more sides. Each of interconnect pads 212, 212', 212" has a first surface disposed over or beneath select portions of the first surface of first semiconductor structure 210. Additionally, each of interconnect pads 214, 214', 214" has a first surface disposed over or beneath select portions of the second surface of first semiconductor structure 210. Additionally, each of interconnect pads 216, 216' is disposed between the first and second surfaces of first semiconductor structure 210 (e.g., over or beneath the second surface of the first section 2110 or the first surface of the second section 2120).

The first semiconductor structure 210 additionally includes a plurality of conductive structures (here, conductive structures 213, 213', 213", 213''', 213'''') which are electrically coupled to the plurality of interconnect pads and may be the same as or similar to conductive structures 1141, 1142, 1143, 1144, 1145, 1146 of third semiconductor structure 130. In the illustrated embodiment, conductive structure 213 (e.g., a via) is electrically coupled to interconnect structures 212, 216, and conductive structure 213' is electrically coupled to interconnect structures 216, 214. Additionally, conductive structure 213" is electrically coupled to interconnect structures 213", 214'. Further, conductive structure 213''' is electrically coupled to interconnect pads 212", 216', and conductive structure 213'''' is electrically coupled to interconnect structures 216', 214".

Second semiconductor structure 230 (e.g., a multi-layer substrate) has first and second opposing surfaces and includes a plurality of layers (here, first and second layers 2130, 2140). The first layer 2130 (e.g., a first substrate layer) has first and second opposing surfaces, with the first surface of the first layer 2130 corresponding to the first surface of the second semiconductor structure 230. Additionally, the second layer 2140 (e.g., a second substrate layer) has first and second opposing surfaces, with the first surface of the second layer 2140 disposed over and coupled to the second surface of the first layer 2130. The second surface of the second layer 2140 corresponds to the second surface of the second semiconductor structure 230 in the illustrated embodiment.

In the illustrated embodiment, first layer 2130 includes a plurality of interconnect pads (here, interconnect pads 2132, 2132', 2132"), each having a first surface disposed over or beneath select portions of the first surface of first layer 2130. Additionally, first layer 2130 includes a plurality of conductive structures (here, conductive structures 2133, 2133', 2133"), each having a first portion electrically coupled a select one of interconnect pads 2132, 2132', and a second opposing portion extending to a select portion of the second surface of first layer 2130.

Additionally, in the illustrated embodiment, second layer 2140 includes a plurality of interconnect pads (here, interconnect pads 2142, 2142', 2142"), each having a first surface disposed over or beneath select portions of the first surface of second layer 2140. Second layer 2140 also includes a plurality of conductive structures (here, conductive structures 2143, 2143', 2143"), each having a first portion electrically coupled a select one of interconnect pads 2142, 2142', 2142", and a second opposing portion extending to a select portion of the second surface of second layer 2140.

Third semiconductor structure 130 is electrically coupled to second semiconductor structure 230 by electrically coupling second surfaces of interconnect pads 132, 132', 132" of third semiconductor structure 130 to second portions of conductive structures 2143, 2143', 2143" of second semiconductor structure 230, or second surfaces of interconnect pads (not shown) of second semiconductor structure 230 which are disposed over and electrically coupled to conductive structures 2143, 2143', 2143'. In one embodiment, the electrical coupling occurs through a reflow process in which the second portions of conductive structures 2143, 2143', 2143" are subjected to controlled thermal energy, which melts one or more portions of conductive structures 2143, 2143', 2143" and interconnect pads 132, 132', 132" together. Third semiconductor structure 130 and second semiconductor structure 230 may also be packaged in accordance with wafer-level packaging (WLP) techniques.

Additionally, second semiconductor structure 230 is electrically coupled to first semiconductor structure 210 through interconnect structures 121, 122, 123 (e.g., solder balls, self-aligned contact pads) which are disposed between the second surfaces of interconnect pads 2132, 2132', 2132" of second semiconductor structure 230 and interconnect pads 214, 214', 214" of first semiconductor structure 210, respectively.

In some embodiments, first semiconductor structure 210 includes more than or less than two sections (i.e., first and second sections 2110, 2120). Additionally, in some embodiments, second semiconductor structure 230 includes more than or less than two layers (i.e., first and second layers 2130, 2140). Further, in some embodiments, third semiconductor structure 130 includes more than or less than three sections (i.e., first, second and third sections 1110, 1120, 1130).

Additionally, in some embodiments, a first predetermined distance of between about twelve micrometers (µm) and about five-hundred µm exists between the first and second surfaces of each of the first and second sections 2110, 2120 of first semiconductor structure 210, the first predetermined distance corresponding to a height (e.g., thickness) of the first and second sections 2110, 2120. Further, in some embodiments, a second predetermined distance of between about one µm and about twenty µm exists between the first and second surfaces of each of the first and second layers 2130, 2140 of second semiconductor structure 230, the second predetermined distance corresponding to a height (e.g., thickness) of the first and second layers 2130, 2140. Further, in some embodiments, a third predetermined distance of between about eighteen and about twenty-two µm exists between the first and second surfaces of third semiconductor structure 130, the third predetermined distance corresponding to a height (e.g., thickness) of the third semiconductor structure 130.

In one embodiment, FIG. 2 shows wafer level packaging of a second semiconductor structure 230 having organic or oxide build-up layers deposited on top of third semiconductor structure 130 as redistribution layer to create larger pitch hybrid structure. A redistribution layer may be added to increase the pitch of the package, the increased pitch allowing for the third semiconductor structure 130 to attach directly to the first semiconductor structure 210. Buildup layers including one or more polymer or polymer-ceramic based composites, polymer nanocomposites, nano-micro composite, hybrid material based photoimagable dielectric, and/or thermal or CVD oxides may be deposited on one or more surfaces of the semiconductor structures. Such approach can also use a redistribution layer of Si-interposer by depositing appropriate oxide layer and, thus, eliminate the need of TSV as well as separate silicon or glass interposer.

Figure 3:
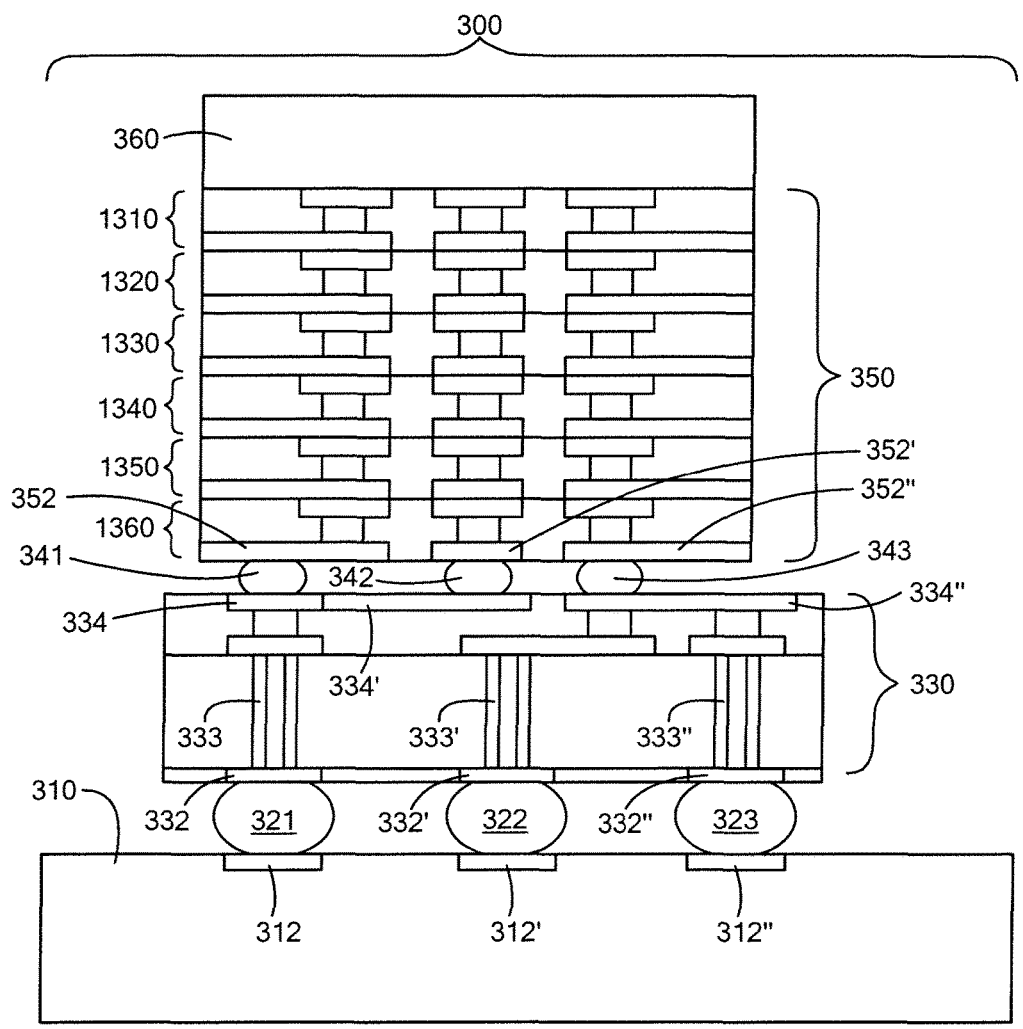
FIG. 3 is a block diagram of another example multi-layer semiconductor device.

Referring now to FIG. 3, an example multi-layer semiconductor device 300 (e.g., a single 3DIC based interposer package 1310) includes a first semiconductor structure 310, a second semiconductor structure 330, and a first plurality of interconnect structures (here, interconnect structures 321, 322, 323) for electrically and mechanically coupling the second semiconductor structure 330 to the first semiconductor structure 310. Multi-layer semiconductor device 300 also includes a third semiconductor structure 350 and a second plurality of interconnect structures (here, interconnect structures 341, 342, 343) for electrically and mechanically coupling the third semiconductor structure 350 to the second semiconductor structure 330.

First semiconductor structure 310 (e.g., a single or multilayer substrate), which has first and second opposing surfaces, includes a plurality of interconnect pads (here, interconnect pads 312, 312', and 312'). Each of interconnect pads 312, 312', and 312' has a first surface which is disposed over or beneath select portions of the second surface of the first semiconductor structure 310. Additionally, in some embodiments, first semiconductor structure 310 (e.g., an organic substrate) includes a plurality of electrical connections (e.g., vias) extending between the first and second surfaces of first semiconductor structure 310, and one or more of interconnect pads 312, 312', 312" is electrically coupled to select ones of the electrical connections.

Second semiconductor structure 330 (e.g., an interposer, such as silicon interposer), which has first and second opposing surfaces, includes a plurality of interconnect pads (here, interconnect pads 332, 332', 332", 334, 334', 334") and a plurality of conductive structures (here, conductive structures 333, 333', 333") which are electrically coupled select ones of the plurality of interconnect pads. Each of interconnect pads 332, 332', 332" has a first surface which is disposed over or beneath select portions of the first surface of the second semiconductor structure 330, and each of interconnect pads 334, 334', 334" has a first surface which is disposed over or beneath select portions of the second surface of the second semiconductor structure 550. In some embodiments, interconnect pads 332, 332', 332" are provided having first dimensions, and one or more of interconnect pads 334, 334', 334" are provided having second, different dimensions (e.g., to provide for varying interconnect pitches). As one example, interconnect pads 334, 334', 334" may have a length between about one and about two micron lines and a space between about two and about four micron may exist between each interconnect pad. Further, the interconnect pads may be shaped to electrically coupled to a via having a particular diameter (e.g., between about four micron and about forty micron). Additionally, in some embodiments, second semiconductor structure 330 may include one or more active devices (e.g., transistors) disposed between the first and second surface of the second semiconductor structure 330.

Third semiconductor structure 350, which is provided as a multi-layer semiconductor structure (e.g., a three-dimensional (3D) integrated circuit (IC)) in the illustrated embodiment, has first and second opposing surfaces and includes a plurality of sections (e.g., functional sections), similar to second semiconductor structure 130 of FIG. 1.

The third semiconductor structure 350 includes a first section 1310 (e.g., a tier-1 functional section) having first and second opposing surfaces, with the first surface of the first section 1310 corresponding to the first surface of third semiconductor structure 350.

First section 3510, similar to the first section 1110 of the second semiconductor structure 130 of FIG. 1, may be fabricated using either Silicon-On-Insulator (SOI) or bulk complementary metal-oxide semiconductor (CMOS) fabrication techniques, for example.

The third semiconductor structure 350 also includes a second section 1320 (e.g., a tier-2 functional section) having first and second opposing surfaces, with the first surface of the second section 1320 disposed over and coupled to the second surface of the first section 1310. Third semiconductor structure 350 additionally includes a third section 1330 (e.g., a tier-3 functional section) having first and second opposing surfaces, with the first surface of the third section 1330 disposed over and coupled to the second surface of the second section 1320. Second and third sections 1320, 1330, similar to the second and third sections 1120, 1130 of the second semiconductor structure 130 of FIG. 1, may be fabricated using either Silicon-On-Insulator (SOI) fabrication techniques, for example.

The third semiconductor structure 350 further includes a fourth section 1340 (e.g., a tier-4 functional section) having first and second opposing surfaces, with the first surface of the fourth section 1340 disposed over and coupled to the second surface of the third section 1330. Third semiconductor structure 350 additionally includes a fifth section 1350 (e.g., a tier-5 functional section) having first and second opposing surfaces, with the first surface of the fifth section 1350 disposed over and coupled to the second surface of the fourth section 1340. Third semiconductor structure 350 additionally includes a sixth section 1360 (e.g., a tier-6 functional section) having first and second opposing surfaces, with the first surface of the sixth section 1360 disposed over and coupled to the second surface of the fifth section 1350 and the second surface of the sixth section 1360 corresponding to the second surface of third semiconductor structure 350. Fourth, fifth and sixth sections 1340, 1350, 1360, similar to the second and third sections 1320, 1330, may be fabricated using either Silicon-On-Insulator (SOI) fabrication techniques, for example.

In some embodiments, a first plurality of the sections (e.g., the first, second, and third sections 1310, 1320, 1330) of the third semiconductor structure 350 are provided as a first portion of the third semiconductor structure 350 and a second plurality of the sections (e.g., the fourth, fifth, and sixth section 1340, 1350, 1360) of the third semiconductor structure 350 are provided as a second portion of the third semiconductor structure 350. In such embodiments, a so-called "via joining layer," as described in co-pending International Application No. PCT/US2015/044608 entitled "Interconnect Structures For Assembly Of Multi-layer Semiconductor Devices," which is assigned to the assignee of the present disclosure and incorporated herein by reference in its entirety, may be disposed between and coupled to select surfaces of each of the first and second portions (i.e., first and second semiconductor structures) of the third semiconductor structure 350 for electrically and mechanically coupling the first and second portions together. The foregoing structure may, for example, provide for increased stacking arrangements of the sections.

Third semiconductor structure 350 is electrically coupled to second semiconductor structure 330 through interconnect structures 341, 342, 343 (e.g., micro bumps) which are disposed between and electrically coupled to the second surfaces of interconnect pads 352, 352', 352" of third semiconductor structure 350 and interconnect pads 334, 334', 334" of second semiconductor structure 330, respectively.

In one embodiment in which the interconnect structures 341, 342, 343 are provided as micro bumps, for example, the interconnect structures 341, 342, 343 may have a diameter between about five micron and about fifty micron, and a pitch between about ten micron and about one hundred micron. Alternatively, in one embodiment in which third semiconductor structure 350 is electrically coupled to second semiconductor structure 330 through direct metal-to-metal bonding (e.g., through copper pillars), the metals typically need to have good planarity and excellent surface quality especially in terms of both particulate and metallic contamination. The low roughness of the copper pillars and interconnect pads, for example, as well as the topology between the copper and oxide areas, are critical to obtain a suitable bond at low force and room temperature. In one aspect, direct metal-to-metal bonding may enable faster placement for 3D IC structures. The direct metal-to-metal bonding may be performed at low force and room temperature which is advantageous for high density interconnect applications requiring high accuracy placement. To ensure void-free bonding, the die placement should typically be carried out in a particle-free environment.

Additionally, second semiconductor structure 330 is electrically coupled to first semiconductor structure 310 through interconnect structures 321, 322, 323 (e.g., controlled collapse chip connection (C4) bumps) which are disposed between and electrically coupled to the second surfaces of interconnect pads 332, 332', 332" of second semiconductor structure 330 and interconnect pads 312, 312', 312" of first semiconductor structure 310, respectively. Those of ordinary skill in the art will understand how to select the size, shape and electrically conductive materials of interconnect structures 321, 323, 333 and of interconnect structures 341, 342, 343 for a particular application (e.g., based on pitch and assembly risk sites).

In accordance with the concepts, systems, circuits and techniques sought to be protected herein, additional sections (e.g., seventh, eighth, etc.) may be added to third semiconductor structure 350 without adding significant height (i.e., a distance between first and second surfaces of third semiconductor structure 350) to third semiconductor structure 350, and thus multi-layer semiconductor device 300. As such, third semiconductor structure 350 requires a smaller interposer footprint to accommodate a plurality of sections (e.g., active materials) than is conventional.

Figure 3A:
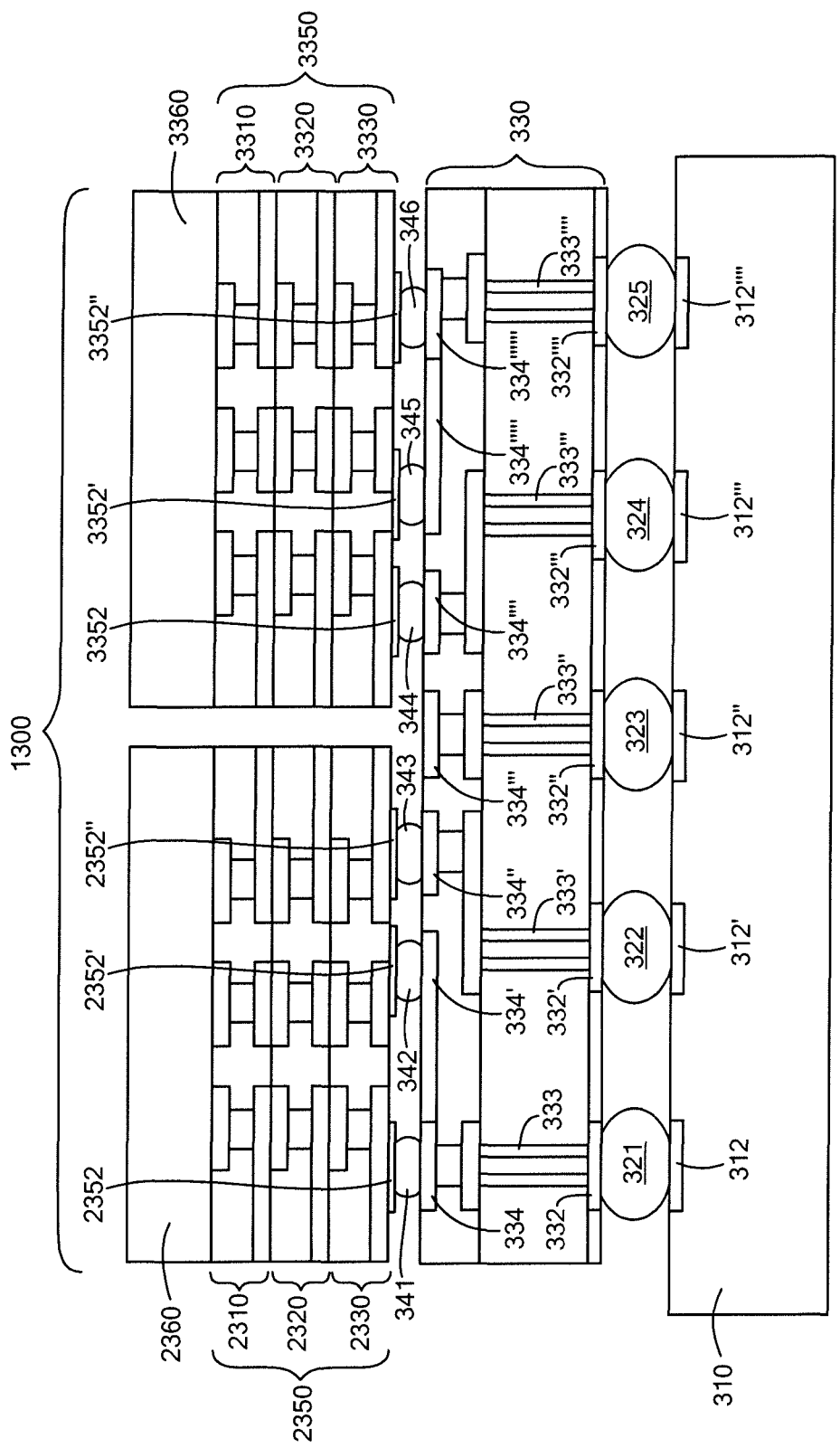
FIG. 3A is a block diagram of an example multi-layer semiconductor device similar to the multi-layer semiconductor device of FIG. 3, for example.

Referring now to FIG. 3A, an example multi-layer semiconductor device 1300 (e.g., a double 3DIC based interposer package) similar to multi-layer semiconductor device 300 of FIG. 3 is shown. Multi-layer semiconductor device 1300 includes the first semiconductor structure 310, the second semiconductor structure 320, and the first plurality of interconnect structures (here, interconnect structures 321, 322, 323, 324, 325). Multi-layer semiconductor device 1300 also includes the second plurality of interconnect structures (here, interconnect structures 341, 342, 343, 344, 345, 346).

In the illustrated embodiment, the first semiconductor structure 310 additionally includes interconnect pads 312''', 312''''. Each of interconnect pads 312''', 312'''' has a first surface which is disposed over or beneath select portions of the second surface of the first semiconductor structure 550.

Additionally, in the illustrated embodiment, the second semiconductor structure 320 further includes interconnect pads 332''', 332'''', 334''', 334'''', 334''''', 334'''''' and conductive structures 333'''', 333'''''' which are electrically coupled to select ones of the interconnect pads.

Multi-layer semiconductor device 1300 further includes a third semiconductor structure 2350 and a fourth semiconductor structure 3350. Each of the third and fourth semiconductor structures 2350, 3350 (e.g., multi-layer semiconductor structures similar to semiconductor structure 130 of FIG. 1) has first and second opposing surfaces and includes a first section (e.g., 2310, 3310) having first and second opposing surfaces, with the first surface of the first section (e.g., a tier-1 functional section) corresponding to the first surface of the third and fourth semiconductor structures. Each of the third and fourth semiconductor structures 2350, 3350 also includes a second section (e.g., 2320, 3320) having first and second opposing surfaces, with the first surface of the second section (e.g., a tier-2 functional section) disposed over and coupled to the second surface of the first section.

Additionally, each of the third and fourth semiconductor structures 2350, 3350 includes a third section (e.g., 2330, 3330) having first and second opposing surfaces, with the first surface of the third section (e.g., a tier-3 functional section) disposed over and coupled to the second surface of the second section and the second surface of the third section corresponding to the second surface of the third and fourth semiconductor structures. Each of the third and fourth semiconductor structures 2350, 3350 also includes a handle structure (e.g., 2360, 3360) having first and second opposing surfaces, with the first surface of each handle structure disposed over first surfaces of the third and fourth semiconductor structures. The handle structures are optional in some embodiments.

Third semiconductor structure 2350 is electrically coupled to second semiconductor structure 330 through interconnect structures 341, 342, 343 which are disposed between and electrically coupled to the second surfaces of interconnect pads 2352, 2352', 2352" of third semiconductor structure 2350 and interconnect pads 334, 334', 334" of second semiconductor structure 330, respectively. Additionally, fourth semiconductor structure 3350 is electrically coupled to second semiconductor structure 330 through interconnect structures 344, 345, 346 which are disposed between and electrically coupled to the second surfaces of interconnect pads 3352, 3352', 3352" of fourth semiconductor structure 3350 and interconnect pads 334"', 334"", 334"''' of second semiconductor structure 330, respectively.

Further, second semiconductor structure 330 is electrically coupled to first semiconductor structure 310 through interconnect structures 321, 322, 323, 324, 325, 326 which are disposed between and electrically coupled to the second surfaces of interconnect pads 332, 332', 332", 332"', 332"" of second semiconductor structure 330 and interconnect pads 312, 312', 312", 312"', 312"" of first semiconductor structure 310, respectively.

Interposer technology is an alternative approach to 3D IC structure stacking in which individual 3D IC structures may be attached with the interposer using micro bumps and subsequently the interposer may be attached to an organic substrate using C4 bumps. Such approach is good for small number of IC structures. However, for a large number of individual IC structures (e.g., 6 individual chip stack), interposer technology may require a larger interposer to accommodate the large number of individual IC structures. FIGS. 3 and 3A shows alternative approaches which requires smaller interposer footprint to accommodate all the functionality and active materials of 6 chips, for example, without adding significant Z-height. FIGS. 3, 3A allow for the assembly of multiple different tiers (1-6) chips (350 in FIGS. 3, 2350 and 3350 in FIG. 3A) to the second semiconductor structure 330 without adding significant Z-height.

Figure 3B:
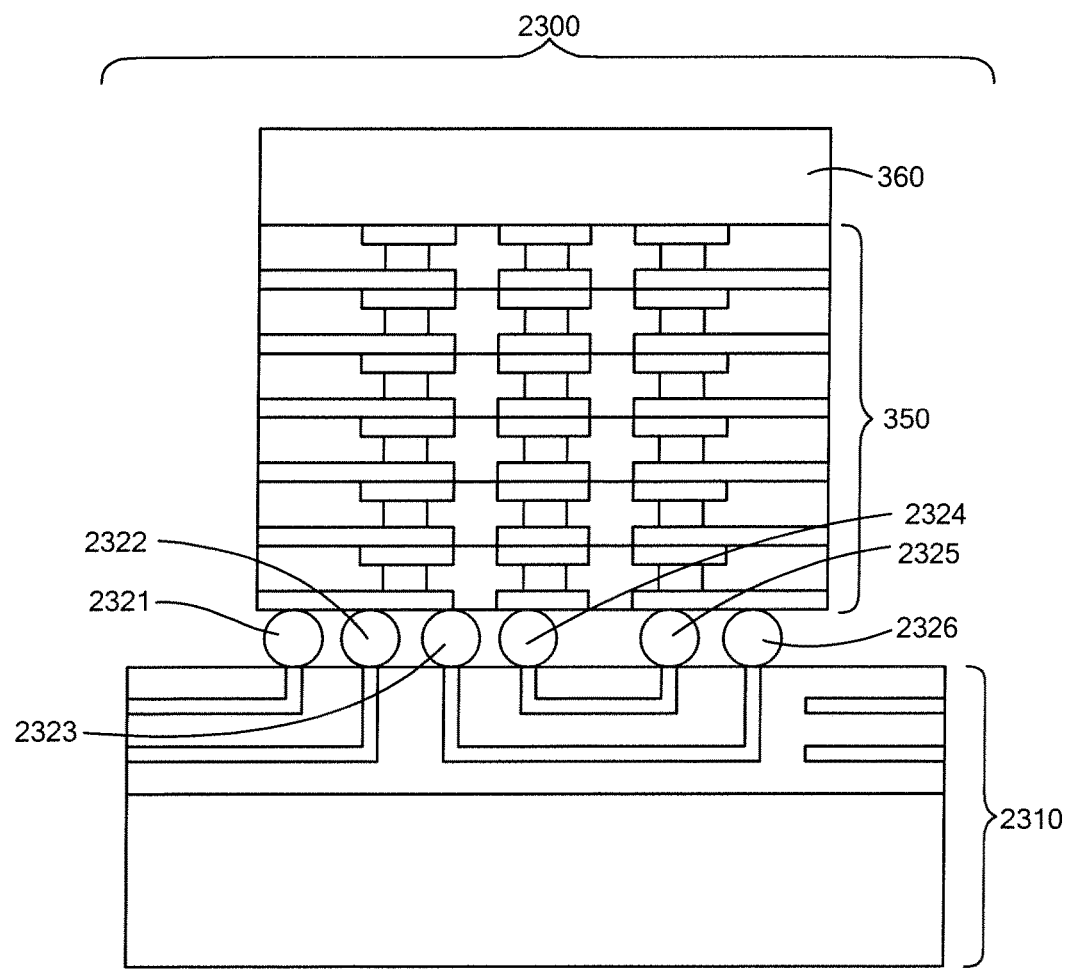
FIG. 3B is a block diagram of another example multi-layer semiconductor device.

Referring now to FIG. 3B, in which like elements of FIG. 3 are provided having like reference designations, an example multi-layer semiconductor device 2300 includes a first semiconductor structure 2310, semiconductor structure 350 (here, a second semiconductor structure 350), and a plurality of interconnect structures (here, interconnect structures 2321, 2322, 2323, 2324, 2325, 2326).

First semiconductor structure 2310 (e.g., a single or multi-layer MCM) has first and second opposing surfaces and a plurality of electrical connections extending between select portions of the first and second surfaces. Interconnect structures 2321, 2322, 2323, 2324, 2325, 2326, which may form a bump (e.g., micro bump) assembly on the second surface of the first semiconductor structure 2310, for example, are electrically coupled to select ones of the electrical connections in the first semiconductor structure 2310. In one embodiment, interconnect structures 2321, 2322, 2323, 2324, 2325, 2326 provide for a first semiconductor structure 2310 with a pitch which is less than about forty μm, which allows for the elimination of the second semiconductor structure 330 (e.g., an interposer), the first semiconductor structure 310 (e.g., an organic substrate), and associated assemblies.

Second semiconductor structure 350 is electrically coupled to first semiconductor structure 2310, and the select ones of the electrical connections in the first semiconductor structure 2310, through the interconnect structures 2321, 2322, 2323, 2324, 2325, 2326, which each have at least a portion electrically coupled to select ones of the interconnect pads 352, 352' 352 of second semiconductor structure 350. The electrical coupling between the first semiconductor structure 2310 and the second semiconductor structure 350 may, for example, occur through a reflow process in which the interconnect structures 2321, 2322, 2323, 2324, 2325, 2326 are subjected to controlled thermal energy, which melts one or more portions of the interconnect structures 2321, 2322, 2323, 2324, 2325, 2326 to select ones of the interconnect pads 352, 352', 352" of second semiconductor structure 350.

In accordance with the concepts, systems, circuits and techniques sought to be protected herein, semiconductor structure 350 provides for a smaller footprint of first semiconductor structure 2310 than is conventional.

Figure 3C:
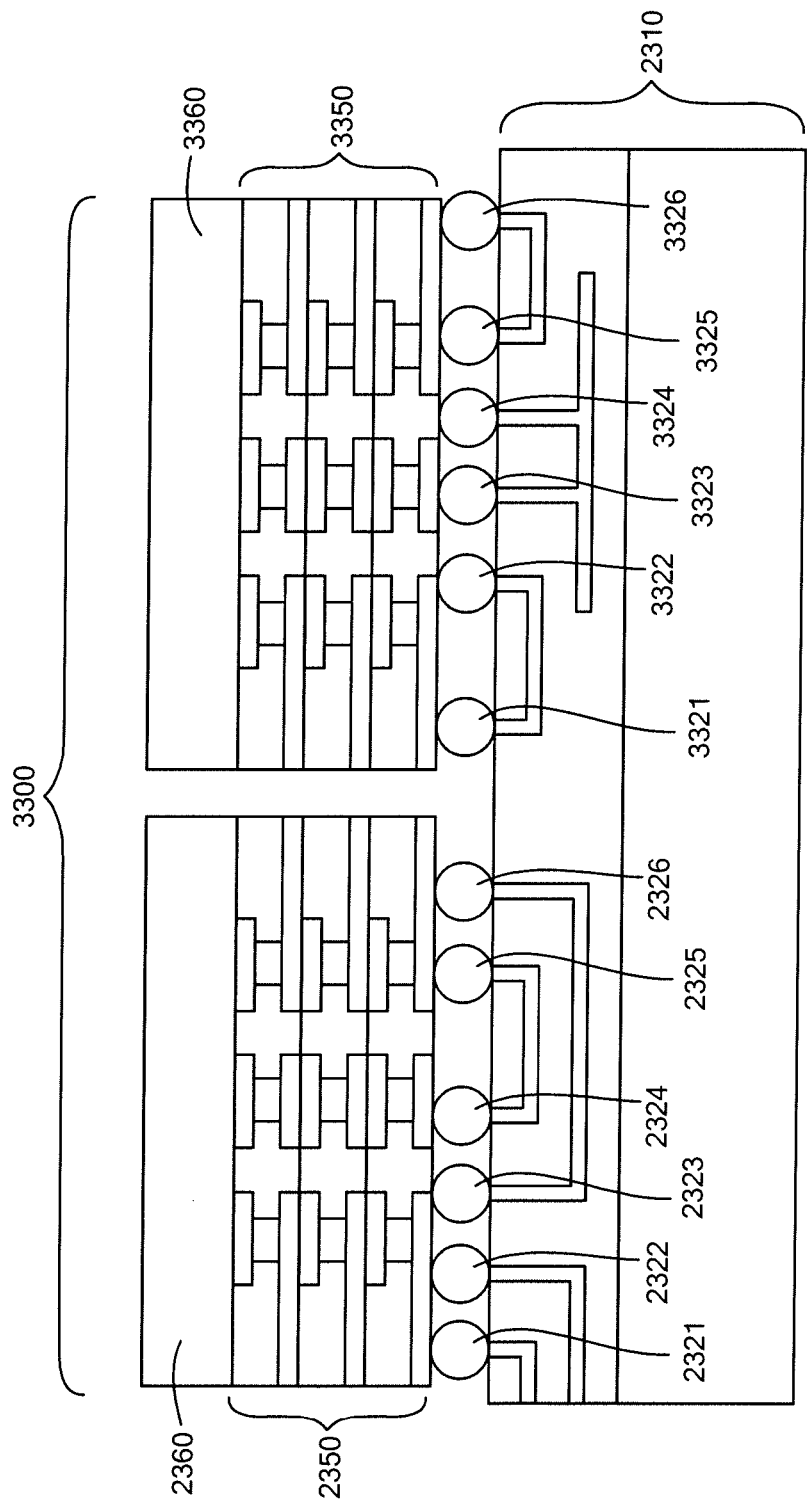
FIG. 3C is a block diagram of an example multi-layer semiconductor device similar to the multi-layer semiconductor device of FIG. 3B, for example.

Referring now to FIG. 3C, in which like elements of FIGS. 3A and 3B are provided having like reference designations, an example multi-layer semiconductor device 3300 includes the first semiconductor structure 2310, the semiconductor structure 2350 (here, second semiconductor structure 2350), the semiconductor structure 3350 (here, third semiconductor structure 3350), and the interconnect structures 2321, 2322, 2323, 2324, 2325, 2326.

Multi-layer semiconductor device 3300 further includes interconnect structures 3321, 3322, 3323, 3324, 3325, 3326. Similar to the interconnect structures 2321, 2322, 2323, 2324, 2325, 2326, interconnect structures 3321, 3322, 3323, 3324, 3325, 3326 are electrically coupled to select ones of the electrical connections in the first semiconductor structure 2310.

Second semiconductor structure 2350 is electrically coupled to first semiconductor structure 2310, and the select ones of the electrical connections in the first semiconductor structure 2310, through the interconnect structures 2321, 2322, 2323, 2324, 2325, 2326, which each have at least a portion electrically coupled to select ones of the interconnect pads 1352, 1352', 1352''' of second semiconductor structure 1350.

Additionally, third semiconductor structure 3350 is electrically coupled to first semiconductor structure 2310, and the select ones of the electrical connections in the first semiconductor structure, through the interconnect structures 3321, 3322, 3323, 3324, 3325, 3326, which each have at least a portion electrically coupled to select ones of the interconnect pads 2352, 2352', 2352''' of second semiconductor structure 2350. FIGS. 3B and 3C, for example, shows alternative approaches which requires smaller Si based MCM (multi chip module) footprint to accommodate all the functionality and active materials of 6 chips without adding significant Z-height. FIGS. 3B, 3C allows to assemble multiple different tiers (1-6) chips (350 in FIG. 3B, 2350 and 3350 in FIG. 3C) to the same MCM (2310) without adding significant Z-height. MCM with micro bump assembly capability (less than about 40 micron) will allow for elimination of the interposer and organic substrate requirement and their associated assemblies.

Figure 4:
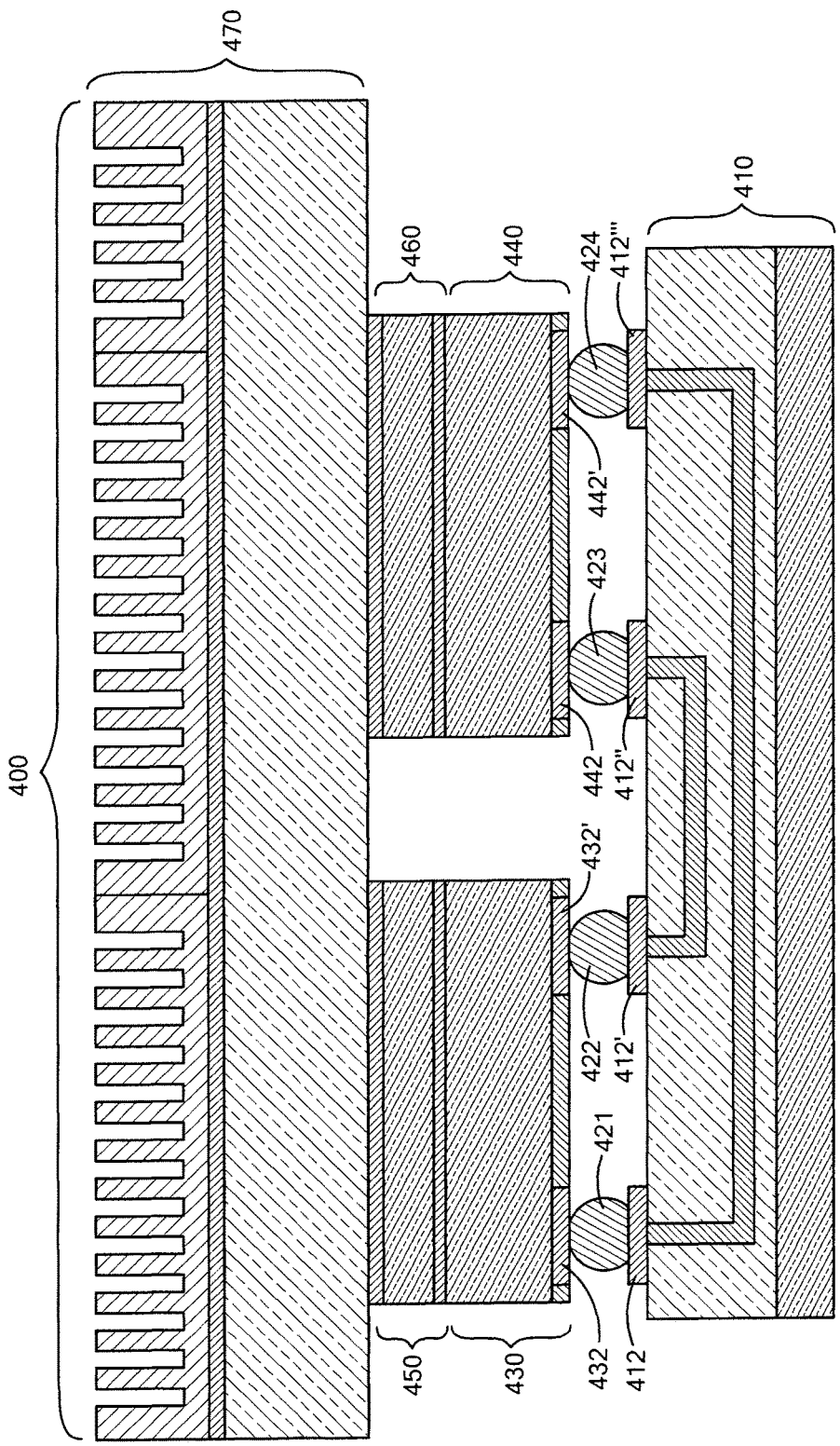
FIG. 4 is a block diagram of another example multi-layer semiconductor device.

Referring now to FIG. 4, another example multi-layer semiconductor device 400 (i.e., a semiconductor structure) includes a first semiconductor structure 410, a second semiconductor structure 430, and third semiconductor structure 440. Semiconductor structure 400 also includes a plurality of interconnect structures (here, interconnect structures 421, 422, 423, 424), which may be the same as or similar to interconnect structures 121, 122, 123 of FIG. 1 in some embodiments, for electrically and mechanically coupling each of the second semiconductor structure 430 and the third semiconductor structure 440 to the first semiconductor structure 410.

First semiconductor structure 410 (e.g., a single or multilayer MCM) has first and second opposing surfaces and a plurality of electrical connections extending between select portions of the first and second surfaces. First semiconductor structure 410 also has a plurality of interconnect pads (here, interconnect pads 412, 412', 412'', and 412'''). Interconnect pads 412 and 412''' are electrically coupled to first select ones of the electrical connections in the first semiconductor structure 410, and interconnect pads 412' and 412'' are electrically coupled to second select ones of the electrical connections in the first semiconductor structure 410.

The second semiconductor structure 430 (e.g., a two-dimensional integrated circuit (IC) structure) has first and second opposing surfaces and a plurality of interconnect pads (here, interconnect pads 432, 432'). A first surface of interconnect pad 432 is disposed over or beneath the first surface of the second semiconductor structure 430 and a second opposing surface of interconnect pad 432' is electrically coupled to the second surface of interconnect pad 412 of first semiconductor structure 410 through interconnect structure 421. Additionally, a first surface of interconnect pad 432' is disposed over or beneath the first surface of the second semiconductor structure 430 and a second opposing surface of interconnect pad 432' is electrically coupled to the second surface of interconnect pad 412' of first semiconductor structure 410 through interconnect structure 422.

The third semiconductor structure 440 (e.g., a three-dimensional IC structure), which may be the same as or similar to semiconductor structure 130 of FIG. 1 in some embodiments, has first and second opposing surfaces and a plurality of interconnect pads (here, interconnect pads 442, 442'). A first surface of interconnect pad 442 is disposed over or beneath the first surface of the third semiconductor structure 440 and a second opposing surface of interconnect pad 442' is electrically coupled to the second surface of interconnect pad 412'' of first semiconductor structure 410 through interconnect structure 423. Additionally, a first surface of interconnect pad 442' is disposed over or beneath the first surface of the third semiconductor structure 440 and a second opposing surface of interconnect pad 442' is electrically coupled to the second surface of interconnect pad 412''' of first semiconductor structure 410 through interconnect structure 423.

One example semiconductor structure suitable for the third semiconductor structure 440 is described in co-pending U.S. patent application Ser. No. 14/694,540 entitled "Interconnect Structures For Fine Pitch Assembly Of Semiconductor Structures," which is assigned to the assignee of the present disclosure and incorporated herein by reference in its entirety. Another example 3D IC structure suitable for the third semiconductor structure 440 is described in co-pending International Application No. PCT/US2015/044608 entitled "Interconnect Structures For Assembly of Multi-layer Semiconductor Devices," which is assigned to the assignee of the present disclosure and incorporated herein by reference in its entirety. Additionally, another example 3D IC structure suitable for the third semiconductor structure 440 is described in co-pending International Application No. PCT/US2015/044651 entitled "Interconnect Structures For Assembly Of Semiconductor Structures Including At least One Integrated Circuit Structure," which is assigned to the assignee of the present disclosure and incorporated herein by reference in its entirety.

Multi-layer semiconductor device 400 further includes a heat dissipation structure 470 (e.g., a heat sink device) and thermal interface structures 450, 460, each of which have first and second opposing surfaces in the illustrated embodiment. Thermal interface structure 450, which may include one or more thermal interface materials (e.g., Indium (In) preform), has a first surface which is disposed over and coupled to a first surface of the heat dissipation structure 470 and a second opposing surface which is disposed over and coupled to the second surface of the second semiconductor structure 430. Additionally, thermal interface structure 460, which may be the same as or similar to thermal interface structure 450 in some embodiments, has a first surface which is disposed over and coupled to the first surface of the heat dissipation structure 470 and a second opposing surface which is disposed over and coupled to the second surface of the third semiconductor structure 440.

Thermal interface structures 450, 460 may, for example, provide mechanical strength to the bond(s) formed between heat dissipation structure 470, second semiconductor structure 430, and third semiconductor structure 440 (i.e., resulting from the coupling), and/or reduce air gaps or spaces which may form between heat dissipation structure 470, second semiconductor structure 430, and third semiconductor structure 440 and act as a thermal insulator, which is undesirable for reasons apparent.

In some embodiments, thermal interface structures 450, 460 additionally include a thermally conductive adhesive (e.g., Nickel, Gold) disposed over at least one of the first and second surfaces of thermal interface structures 450, 460. Such may, for example, provide for increased heat dissipation between second semiconductor structure 430, third semiconductor structure 440, and heat dissipation structure 470.

Figure 5:
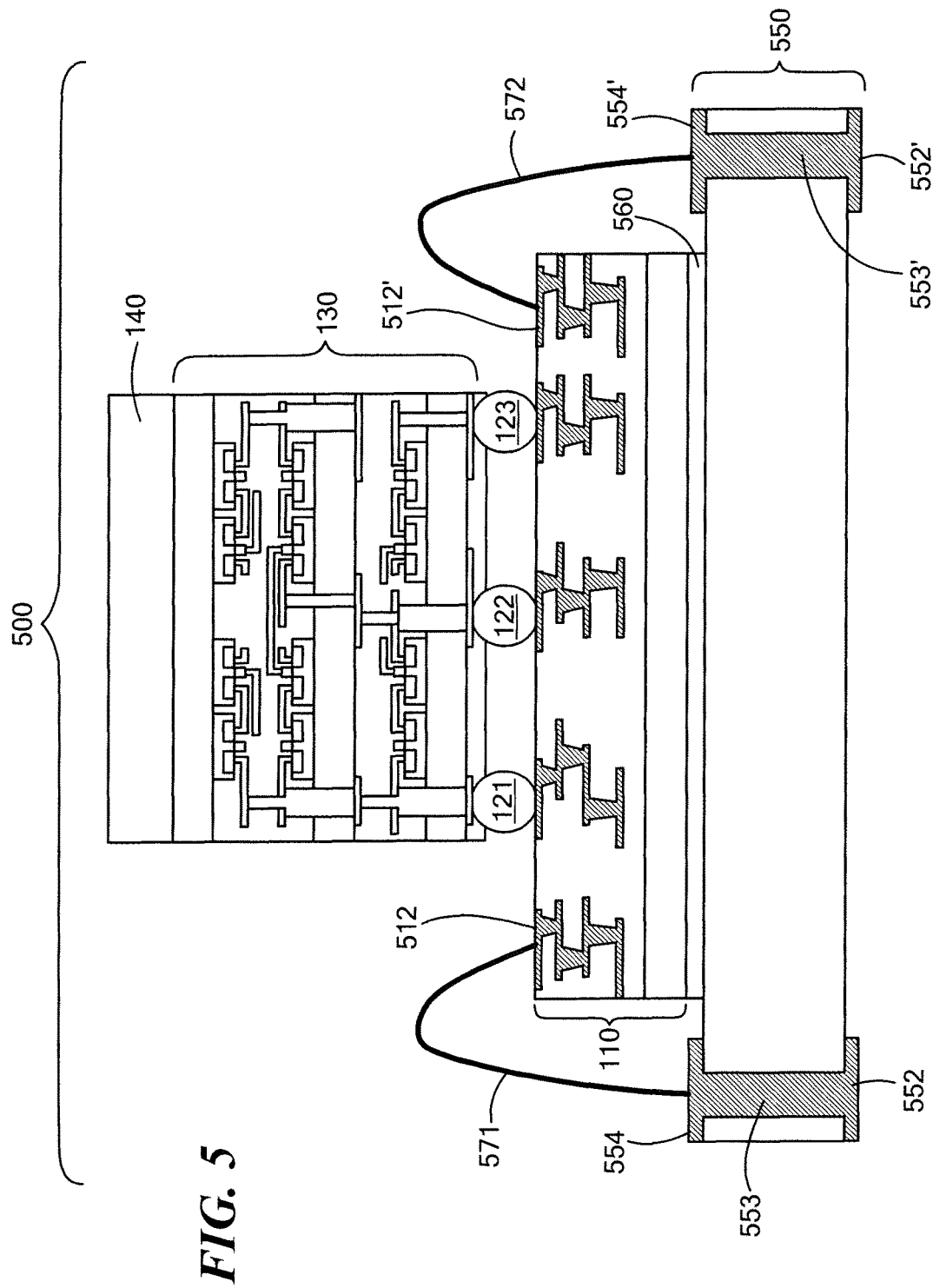
FIG. 5 is a block diagram of another example multi-layer semiconductor device.

Referring now to FIG. 5, in which like elements of FIG. 1 are provided having like reference designations, a multi-layer semiconductor structure 500 includes the first semiconductor structure 110, a plurality of interconnect structures (here, interconnect structures 121, 122, 123), the second semiconductor structure 130, and the handle structure 140.

In the illustrated embodiment, the first semiconductor structure 110 additionally includes interconnect pads 512, 512', each having a first surface disposed over or beneath select portions of the second surface of first semiconductor structure 110. Additionally, each of interconnect pads 512, 512' is electrically coupled to select ones (here, fourth and fifth select ones, respectively) of the electrical connections in first semiconductor structure 110.

Multi-layer semiconductor structure 500 also includes a third semiconductor structure 550 (e.g., PCB or substrate) and an adhesive layer 560 disposed between the first semiconductor structure 110 and the third semiconductor structure 550. The third semiconductor structure 550, which has first and second opposing surfaces, includes a plurality of interconnect pads (here, interconnect pads 552, 552', 554, 554') and a plurality of conductive structures (here, conductive structures 553, 553') which are electrically coupled to the plurality of interconnect pads. Each of interconnect pads 552, 552' has a first surface which is disposed over or beneath select portions of the first surface of the third semiconductor structure 550, and each of interconnect pads 554, 554' has a first surface which is disposed over or beneath select portions of the second surface of the third semiconductor structure 550. Conductive structure 553 (e.g., a via) has a first portion electrically coupled to the first surface of interconnect pad 552 and a second opposing portion electrically coupled to the first surface of interconnect pad 554. Additionally, conductive structure 553' has a first portion electrically coupled to the first surface of interconnect pad 552' and a second opposing portion electrically coupled to the first surface of interconnect pad 554'.

The adhesive layer 560, which may include one or more adhesive materials (e.g., glues, pastes, epoxies, adhesive tapes), has a first surface disposed over and coupled to the second surface of the third semiconductor structure 550. The adhesive layer 560 also has a second opposing surface disposed over and coupled the first surface of first semiconductor structure 110. Adhesive layer 560 couples the first semiconductor structure 110 to the third semiconductor structure 550 to form a multi-layer semiconductor structure (i.e., multi-layer semiconductor structure 500) including three semiconductor structures (i.e., first semiconductor structure 110, second semiconductor structure 130, and third semiconductor structure 550).

Multi-layer semiconductor structure 500 further includes a plurality of wire bonding structures (here, wire bonding structures 571, 572), the wire bonding structures forming a plurality of electrical connections (here, first and second electrical connections) between third semiconductor structure 550 and first semiconductor structure 110. Wire bonding structure 571, which forms a first electrical connection between third semiconductor structure 550 and first semiconductor structure 110, has a first portion electrically coupled to the second surface of interconnect pad 554 of third semiconductor structure 550, and a second opposing portion electrically coupled to a surface (i.e., a second surface) of interconnect pad 512 of first semiconductor structure 110. Additionally, wire bonding structure 572, which forms a second electrical connection between third semiconductor structure 550 and first semiconductor structure 110, has a first portion electrically coupled to the second surface of interconnect pad 554' of third semiconductor structure 550, and a second opposing portion electrically coupled to a surface (i.e., a second surface) of interconnect pad 512' of first semiconductor structure 110.

Figure 5A:
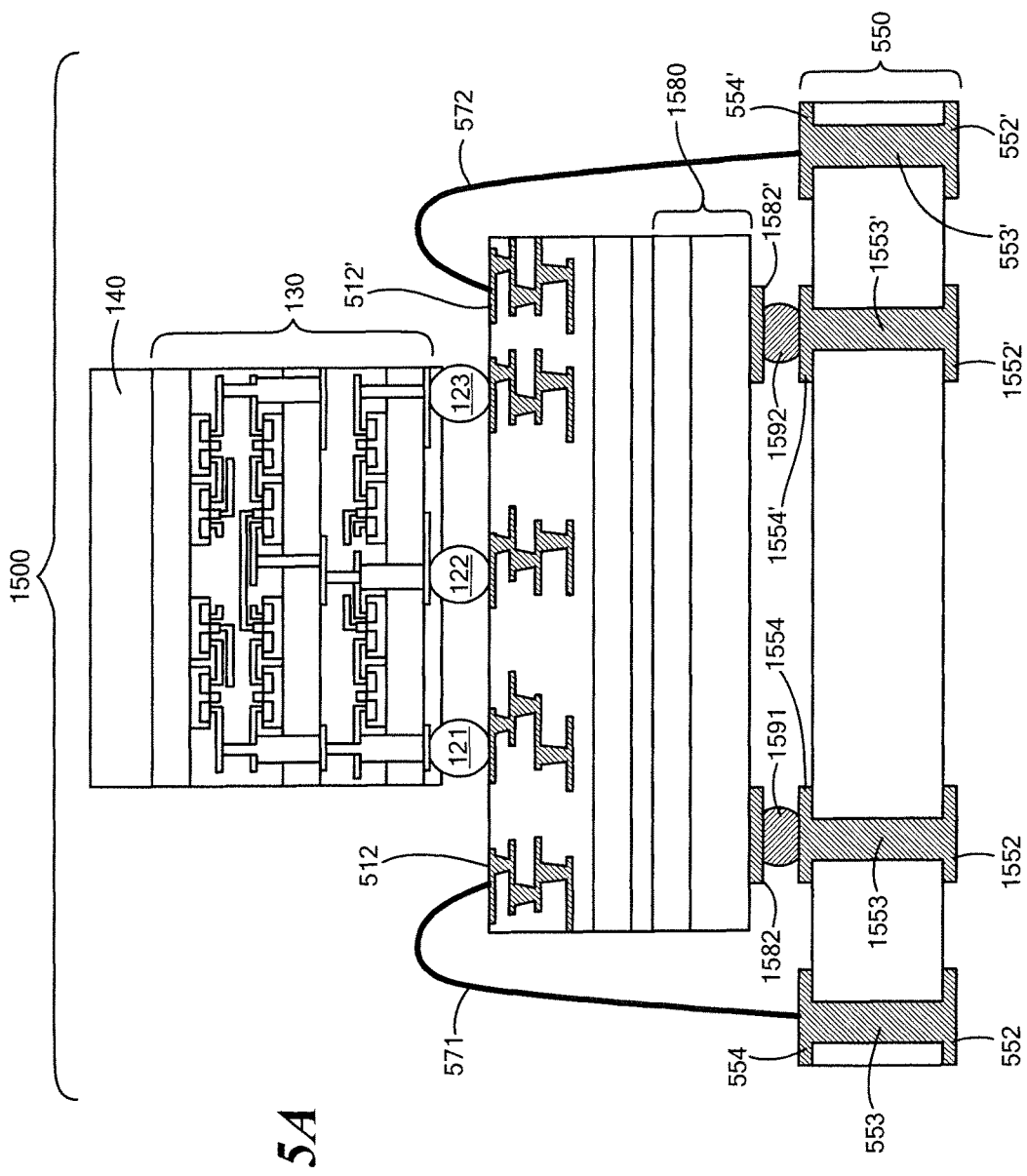
FIG. 5A is a block diagram of an example multi-layer semiconductor device similar to the multi-layer semiconductor device of FIG. 5, for example.

Referring now to FIG. 5A, an example multi-layer semiconductor structure 1500 similar to multi-layer semiconductor structure 500 of FIG. 5 is shown. Multi-layer semiconductor structure 1500 includes the first semiconductor structure 110, the plurality of interconnect structures (here, interconnect structures 121, 122, 123), the second semiconductor structure 130, and the handle structure 140. Multi-layer semiconductor structure 1500 also includes the third semiconductor structure 550, the adhesive layer 560, and the plurality of wire bonding structures (here, wire bonding structures 571, 572).

In the illustrated embodiment, the third semiconductor structure 550 additionally includes interconnect pads 1552, 1552', 1554, 1554' and conductive structures 1553, 1553' which are electrically coupled to select ones of the interconnect pads. Each of interconnect pads 1552, 1552' has a first surface which is disposed over or beneath select portions of the first surface of the third semiconductor structure 550, and each of interconnect pads 1554, 1554' has a first surface which is disposed over or beneath select portions of the second surface of the third semiconductor structure 550. Conductive structure 1553 has a first portion electrically coupled to the first surface of interconnect pad 1552 and a second opposing portion electrically coupled to the first surface of interconnect pad 1554. Additionally, conductive structure 1553' has a first portion electrically coupled to the first surface of interconnect pad 1552' and a second opposing portion electrically coupled to the first surface of interconnect pad 1554'.

Additionally, in the illustrated embodiment, multi-layer semiconductor structure 1500 further includes a fourth semiconductor structure 1580 (e.g., 2D IC structure, 3D IC structure) and a plurality of interconnect structures (here, interconnect structures 1591, 1592) for electrically and mechanically coupling the third semiconductor structure 550 to the fourth semiconductor structure 1580. Fourth semiconductor structure 1580 has first and second opposing surfaces and a plurality of interconnect pads (here, interconnect pads 1582, 1582'). A first surface of interconnect pad 1582 is disposed over or beneath the first surface of the fourth semiconductor structure 1580 and a second opposing surface of interconnect pad 1582 is electrically coupled to the second surface of interconnect pad 1554 of third semiconductor structure 550 through interconnect structure 1591.

Additionally, a first surface of interconnect pad 1582' is disposed over or beneath the first surface of the fourth semiconductor structure 1580 and a second opposing surface of interconnect pad 1582' is electrically coupled to the second surface of interconnect pad 1554' of third semiconductor structure 550 through interconnect structure 1592. Further, in the illustrated embodiment, the adhesive layer 560 is disposed between the first surface of first semiconductor structure 110 and the second surface of fourth semiconductor structure 1580. In one embodiment, the first surface of first semiconductor structure 110 is bonded to the second surface of fourth semiconductor structure 1580 via the adhesive layer 560 through a flip-chip process, for example, in which the fourth semiconductor structure 1580 is directly bonded to third semiconductor structure 550. In one embodiment, it is possible to use multiple fourth semiconductor structure s1580 instead of a single fourth semiconductor structure 1580. First semiconductor structure 110 is wire bonded to the third semiconductor structure 550 for system level integration. This way we can utilize all the real estate of third semiconductor structure 550.

Figure 6:
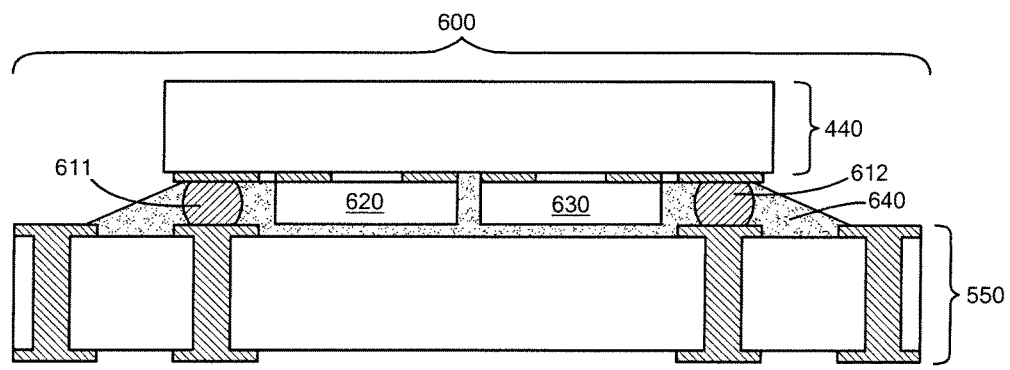
FIG. 6 is a block diagram of another example multi-layer semiconductor device.

Referring now to FIG. 6, an example multi-layer semiconductor structure 600 includes the semiconductor structure 550 (here, a first semiconductor structure 550), the semiconductor structure 440 (here, a second semiconductor structure 440) and a plurality of interconnect structures (here, interconnect structures 611, 612) for electrically and mechanically coupling second semiconductor structure 440 to first semiconductor structure 550. Multi-layer semiconductor structure 600 also includes an optional "underfill" material 640 (e.g., an electrically-insulating material such as anisotrpic conductive paste (ACP)) disposed between select portions of the first surface of second semiconductor structure 440 and the second surface of first semiconductor structure 550. In one embodiment, the underfill material may be dispensed around the edge of second semiconductor structure 440 at around sixty degrees Celsius. Viscosity of underfill will be very low at 60 degrees C. to have capillary action to fill the gaps between the surfaces. In one embodiment, second semiconductor structure 440 is electrically coupled to the first semiconductor structure 550 through a flip chip process (e.g., for system level integration).

Multi-layer semiconductor structure 600 additionally includes a third semiconductor structure 620 and a fourth semiconductor structure 630, each of which are similar to second semiconductor structure 440 in the illustrated embodiment. Third and fourth semiconductor structures 620, 630 each have a first surface which is electrically coupled to select portions of the first surface of second semiconductor structure 440.

Figure 6A:
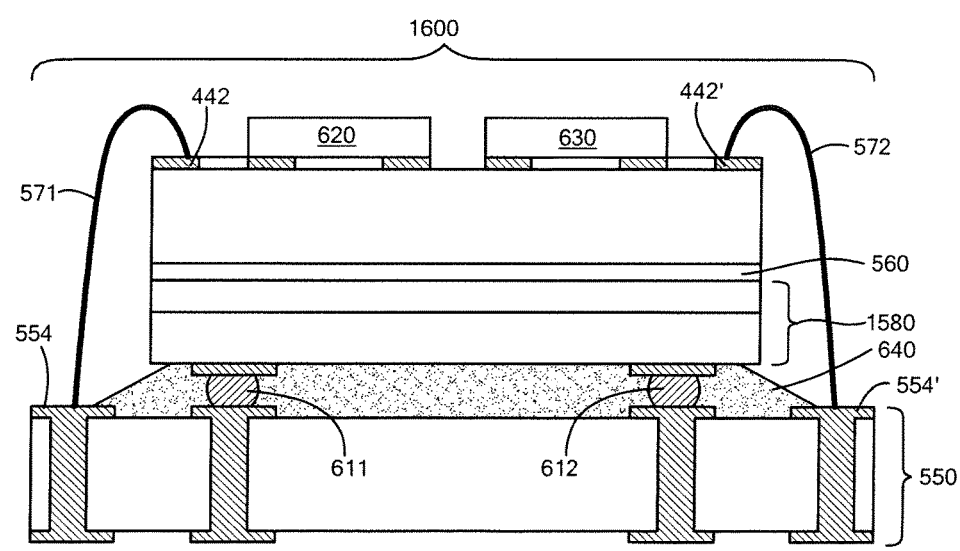
FIG. 6A is a block diagram of an example multi-layer semiconductor device similar to the multi-layer semiconductor device of FIG. 6, for example.

Referring now to FIG. 6A, in which like elements of FIGS. 5A and 6 are provided having like reference designations, an example multi-layer semiconductor device 1600 includes semiconductor structure 550 (here, a first semiconductor structure 550), semiconductor structure 1580 (here, a second semiconductor structure 1580), semiconductor structure 440 (here, a third semiconductor structure 440), semiconductor structure 620 (here, a fourth semiconductor structure 620), and semiconductor structure 630 (here, a fifth semiconductor structure 630). Multi-layer semiconductor device 1600 also includes a plurality of interconnect structures (here, interconnect structures 611, 612) for electrically and mechanically coupling second semiconductor structure 1580 to first semiconductor structure 550. Multi-layer semiconductor structure 1600 further includes the underfill material 640, which is disposed between select portions of the first surface of second semiconductor structure 1580 and the second surface of first semiconductor structure 550.

Multi-layer semiconductor structure 1600 also includes the adhesive layer 560, which is disposed between second surfaces of second semiconductor structure 1580 and third semiconductor structure 440. Multi-layer semiconductor structure 1600 further includes wire bonding structures 571, 572. Wire bonding structure 571, which forms a first electrical connection between first semiconductor structure 550 and third semiconductor structure 440, has a first portion electrically coupled to the second surface of interconnect pad 554 of first semiconductor structure 550, and a second opposing portion electrically coupled to a surface (i.e., a second surface) of interconnect pad 442 of third semiconductor structure 440. Additionally, wire bonding structure 572, which forms a second electrical connection between first semiconductor structure 550 and third semiconductor structure 440, has a first portion electrically coupled to the second surface of interconnect pad 554' of first semiconductor structure 550, and a second opposing portion electrically coupled to a surface (i.e., a second surface) of interconnect pad 442' of third semiconductor structure 440.

Figure 7:
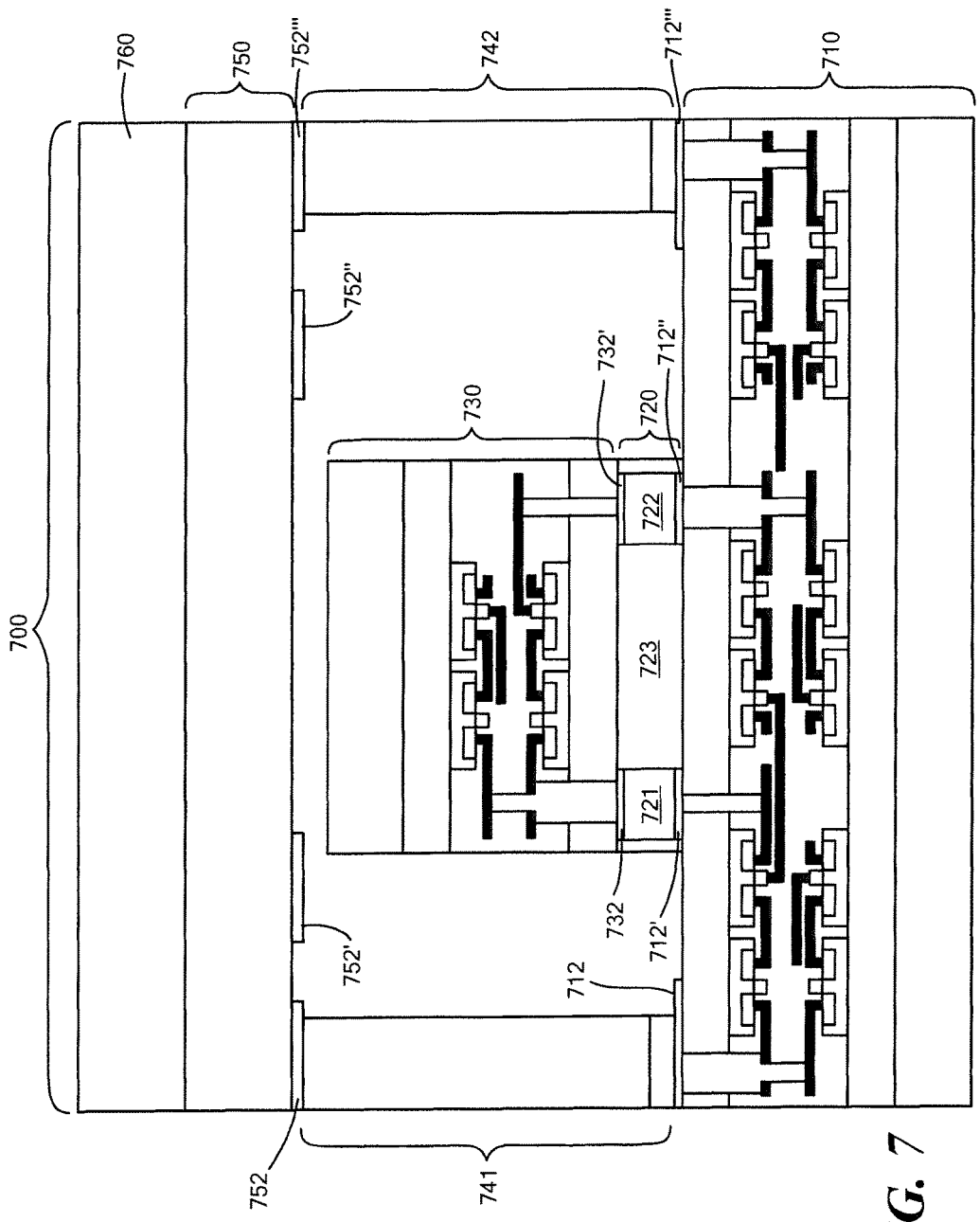
FIG. 7 is a block diagram of another example multi-layer semiconductor device.

Referring now to FIG. 7, an example multi-layer semiconductor device 700 includes a first semiconductor structure 710 and a second semiconductor structure 730, each of which may be fabricated in a similar manner as semiconductor structure 130 of FIG. 1, for example. Each of the first and second semiconductor structures 710, 730 includes a plurality of sections (here, first and second sections).

Multi-layer semiconductor device 700 also includes an interconnect structure 720 which is disposed between and coupled to second surfaces of each of the first and second semiconductor structures 710, 730. Interconnect structure 720 has first and second opposing surfaces and includes a plurality of conductive structures (here, first and second conductive structures 721, 722) extending between select portions of the first and second surfaces. Interconnect structure 720 also includes an oxide material (or layer) 723 disposed between select portions of the first and second surfaces of the interconnect structure 720.

First conductive structure 721 (e.g., micro via, submicron via) has a first portion electrically coupled to a second surface of interconnect pad 712' of first semiconductor structure 710 and a second, opposing portion electrically coupled to a second surface of interconnect pad 732 of second semiconductor structure 730. Additionally, second conductive structure 722 has a first portion electrically coupled to a second surface of interconnect pad 712" of first semiconductor structure 710 and a second, opposing portion electrically coupled to a second surface of interconnect pad 732' of second semiconductor structure 730. In doing so, interconnect structure 720 electrically couples first semiconductor structure 710 to second semiconductor structure 720. In some embodiments, a predetermined distance of between about one μm and about two μm exists between first and second surfaces of interconnect structure 720, the predetermined distance corresponding to a height (i.e., thickness) of the interconnect structure 720.

Multi-layer semiconductor device 700 additionally includes a third semiconductor structure 750 (e.g., a silicon or ceramic based MCM) having first and second opposing surfaces and a handle structure 760. The third semiconductor structure 750 is electrically coupled to first semiconductor structure 710 through conductive structures 741, 742 (e.g., Copper (Cu)) pillars having at least one solder based portion (e.g., to provide minimum spreading during bonding to create finer pitch assembly). A first portion of conductive structure 741 is electrically coupled to a second surface of interconnect pad 712 of first semiconductor structure 710 and a second, opposing portion of conductive structure 741 is electrically coupled to a second surface of interconnect pad 752' of third semiconductor structure 750. A first portion of conductive structure 742 is electrically coupled to a second surface of interconnect pad 712''' of first semiconductor structure 710 and a second, opposing portion of conductive structure 742 is electrically coupled to a second surface of interconnect pad 752''' of third semiconductor structure 750.

In one alternative embodiment, interconnect structure 720 may be a direct copper-to-copper bonding means which enables fast placement of the semiconductor structures (e.g., 3D-ICs).

Figure 8:
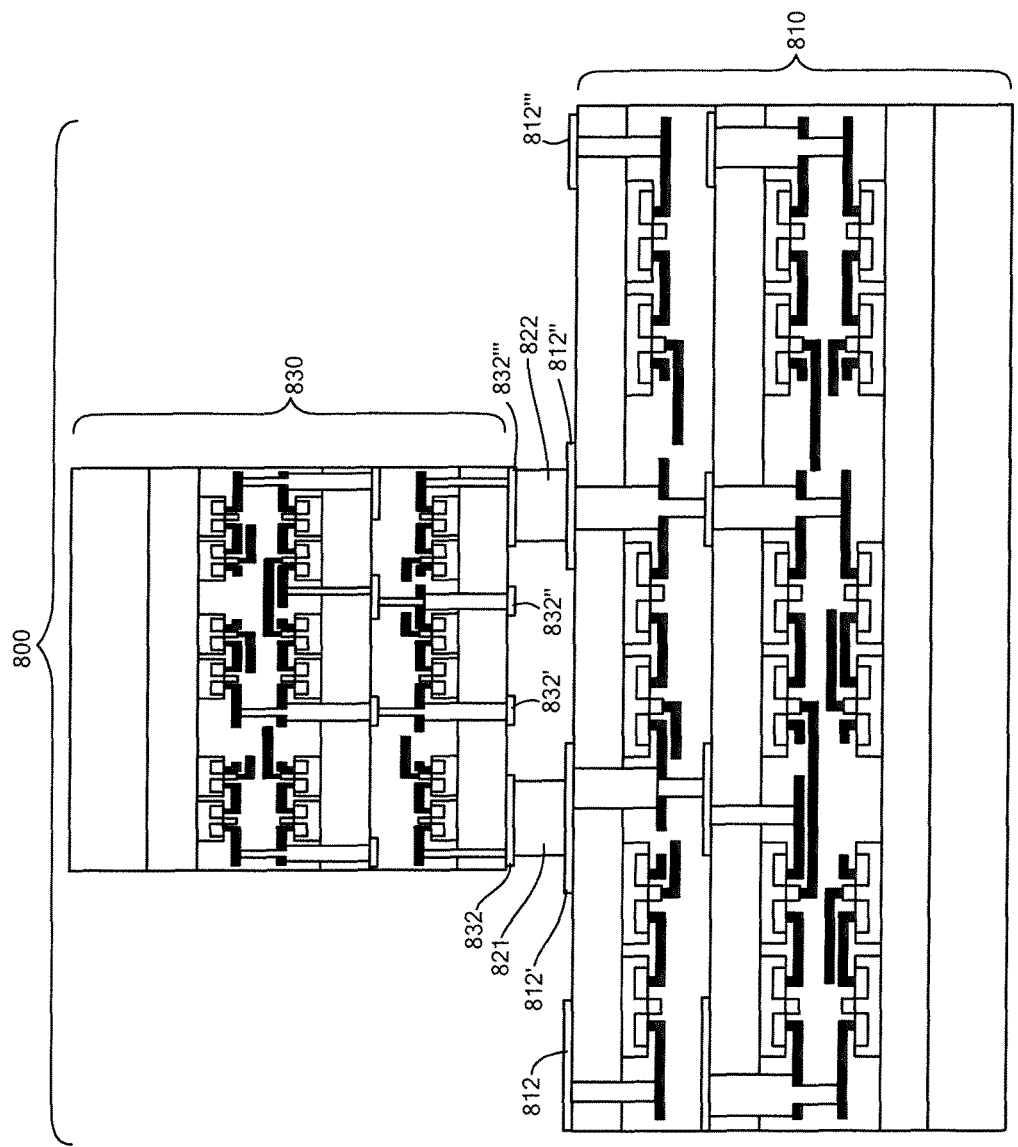
FIG. 8 is a block diagram of another example multi-layer semiconductor device.

Referring now to FIG. 8, another example multi-layer semiconductor device 800 includes a first semiconductor structure 810 and a second semiconductor structure 830, each of which may also be fabricated in a similar manner as semiconductor structure 130 of FIG. 1, for example. Each of the first and second semiconductor structures 810, 830 includes a plurality of sections (here, first, second and third sections). As illustrated, a first one of the semiconductor structures (e.g., 810) is provided having a first form factor and a second one of the semiconductor structures (e.g., 830) is provided having a second, different form factor.

Multi-layer semiconductor device 800 also includes a plurality of interconnect structures (here, interconnect structures 821, 822) for electrically and mechanically coupling the second semiconductor structure 830 to the first semiconductor structure 810.

While the above figures illustrate various multi-layer semiconductor devices and semiconductor structures including a certain number of dies, interconnects, substrates, IC devices, components and the like, the concepts, systems, circuits and techniques disclosed herein may be applied to multi-layer semiconductor devices and semiconductor structures including any number of dies, interconnects, substrates, IC devices, components and the like.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

The invention claimed is:

1. A multi-layer semiconductor device, comprising:
    a first semiconductor structure having first and second opposing surfaces and a plurality of electrical connections extending between select portions of the first and second surfaces;
    a second semiconductor structure having first and second opposing surfaces, the second semiconductor structure comprising:
        a first multi-layer section including a first device layer having first and second opposing surfaces and a plurality of electrical connections extending between select portions of the first and second surfaces;
        a second multi-layer section having first and second opposing surfaces, wherein the first surface of the second multi-layer section is disposed over and coupled to the second surface of the first multi-layer section, the second multi-layer section including:
            a second device layer having first and second opposing surfaces and a plurality of electrical connections extending between the first and second surfaces, wherein the second surface of the second device layer corresponds to the second surface of the second multi-layer section; and
            an insulating layer having first and second opposing surfaces, wherein the first surface of the insulating layer corresponds to the first surface of the second multi-layer section, and wherein the first surface of the insulating layer is coupled to the second surface of the first multi-layer section;
        one or more conductive structures extending between select ones of the electrical connections in the first multi-layer section, select ones of the electrical connections in the device layer of the second multi-layer section, and select portions on or beneath the second surface of the second semiconductor structure;
        one or more interconnect pads having first and second opposing surfaces and one or more sides, wherein the first surface of each one of the interconnect pads is disposed over or beneath select portions of at least the second surface of the second semiconductor structure and select ones of the interconnect pads are electrically coupled to select ones of the conductive structures; and
        one or more 3D-vias extending from the second surface of the second multi-layer section and passing through the device layer of the second multi-layer section and through the insulating layer and into the first multi-layer section to electrically connect the device layer of the first multi-layer section to the device layer of the second multi-layer section; and
    one or more interconnect structures disposed between and coupled to select portions of second surfaces of each of the first and second semiconductor structures, wherein at least one of the interconnect structures is electrically coupled to the second surface of a select one of the interconnect pads of the second semiconductor structure to form one or more electrical connections between the first and second semiconductor structures.

2. The multi-layer semiconductor device of claim 1 wherein the first semiconductor structure is a multi-chip module (MCM).

3. The multi-layer semiconductor device of claim 2 wherein the interconnect structures are electrically coupled to select ones of the electrical connections in the first semiconductor structure and form a micro bump assembly on the second surface of the first semiconductor structure.

4. The multi-layer semiconductor device of claim 2 wherein the first semiconductor structure further includes:
    one or more interconnect pads having first and second opposing surfaces and one or more sides, wherein the first surface of first select ones of the interconnect pads is disposed over or beneath select portions of at least the second surface of the first semiconductor structure and select ones of the first select ones of the interconnect pads are electrically coupled to select ones of the electrical connections, and the at least one interconnect structure of the multi-layer semiconductor device is further electrically coupled to a first one of the select ones of interconnect pads of the first semiconductor structure to form a first one of the electrical connections between the first semiconductor structure and the second semiconductor structure.

5. The multi-layer semiconductor device of claim 1 wherein the second semiconductor structure further includes:
    a third multi-layer section having first and second opposing surfaces, wherein the first surface of the third multi-layer section is disposed over and coupled to the second surface of the second multi-layer section, the third multi-layer section including:
        a third device layer having first and second opposing surfaces and a plurality of electrical connections extending between the first and second surfaces, wherein the second surface of the third device layer corresponds to the second surface of the third multi-layer section; and an insulating layer having first and second opposing surfaces, wherein the first surface of the insulating layer corresponds to the first surface of the third multi-layer section, wherein at least one of the conductive structures in the second semiconductor structure extends between select ones of the electrical connections in the second device layer of the second multi-layer section, select ones of the electrical connections in the third device layer of the third multi-layer section, and first surfaces of select ones of the interconnect pads of the second semiconductor structure.

6. The multi-layer semiconductor device of claim 5 wherein a predetermined distance of between about six micrometers (µm) and about eight µm exists between the first and second surfaces of each of the first, second and third multi-layer sections of the second semiconductor structure, wherein the predetermined distance corresponds to a height of the first, second and third multi-layer sections of the second semiconductor structure.

7. The multi-layer semiconductor device of claim 5 wherein at least the second and third multi-layer sections of the second semiconductor structure is fabricated using Silicon-On-Insulator (SOI) fabrication techniques.

8. The multi-layer semiconductor device of claim 1 wherein the first multi-layer section of the second semiconductor structure is fabricated using either SOI or bulk complementary metal-oxide semiconductor (CMOS) fabrication techniques.

9. The multi-layer semiconductor device of claim 1 wherein at least one of the one or more conductive structures extending between select ones of the electrical connections in the first multi-layer section and select ones of the electrical connections in the device layer of the second multi-layer section is provided as a through insulator via (TIV) or a through oxide via (TOV) conductive structure.

10. The multi-layer semiconductor device of claim 1 wherein the interconnect structures are provided from one or more fusible conductive materials.

11. The multi-layer semiconductor device of claim 10 wherein the interconnect structures have first and second opposing portions, wherein a predetermined distance of between about five micrometers (µm) and about one-hundred µm exists between the first and second portions of the interconnect structures, wherein the predetermined distance corresponds to a height of the interconnect structures.

12. The multi-layer semiconductor device of claim 1 further comprising:
a third semiconductor structure having first and second opposing surfaces; and
one or more interconnect structures disposed between and coupled to select portions of the first surface of the first semiconductor structure and select portions of the second surface of the third semiconductor structure.

13. The multi-layer semiconductor device of claim 12 wherein the third semiconductor structure is a printed circuit board (PCB) or a substrate based redistribution layer configured to increase an interconnect pitch of the multi-layer semiconductor device.

14. The multi-layer semiconductor device of claim 13 further comprising:
one or more wire bond structures, wherein at least one of the wire bond structures has a first portion electrically coupled to the second surface of the third semiconductor structure and a second opposing portion is electrically coupled to the second surface of the first semiconductor structure to form one or more electrical connections between the third and first semiconductor structures.

15. The multi-layer semiconductor device of claim 12 wherein the first semiconductor structure is an interposer module.

16. The multi-layer semiconductor device of claim 15 further comprising:
a fourth semiconductor structure having first and second opposing surfaces, the fourth semiconductor structure comprising:
a first multi-layer section including a first device layer having first and second opposing surfaces and a plurality of electrical connections extending between select portions of the first and second surfaces, wherein the first surface of the first multi-layer section corresponds to the first surface of the fourth semiconductor structure;
a second multi-layer section having first and second opposing surfaces, wherein the first surface of the second multi-layer section is disposed over and coupled to the second surface of the first multi-layer section, the second multi-layer section including:
a second device layer having first and second opposing surfaces and a plurality of electrical connections extending between the first and second surfaces, wherein the second surface of the second device layer corresponds to the second surface of the second multi-layer section; and
an insulating layer having first and second opposing surfaces, wherein the first surface of the insulating layer corresponds to the first surface of the second multi-layer section;
one or more conductive structures extending between select ones of the electrical connections in the first multi-layer section, select ones of the electrical connections in the device layer of the second multi-layer section, and select portions on or beneath the second surface of the fourth semiconductor structure; and
one or more interconnect pads having first and second opposing surfaces and one or more sides, wherein the first surface of each one of the interconnect pads is disposed over or beneath select portions of at least the second surface of the fourth semiconductor structure and select ones of the interconnect pads are electrically coupled to select ones of the conductive structures;
one or more 3D-vias extending from the second surface of the second multi-layer section and passing through the device layer of the second multi-layer section and through the insulating layer to electrically connect the second surface of the first multi-layer section of the fourth semiconductor structure; and
one or more interconnect structures disposed between and coupled to select portions of second surfaces of each of the first and fourth semiconductor structures, wherein at least one of the interconnect structures is electrically coupled to the second surface of a select one of the interconnect pads of the fourth semiconductor structure to form one or more electrical connections between the first and fourth semiconductor structures.

17. The multi-layer semiconductor device of claim 1, wherein the second surface of the second multi-layer section includes circuit components, devices and modules comprising at least one of a resistor, capacitor, transistor, inductor, and integrated circuit; and wherein the first multi-layer section and the second multi-layer section are coupled together by wafer-to-wafer bonding.

18. A method for fabricating a multi-layer semiconductor device, comprising:
providing a first semiconductor structure having first and second opposing surfaces and one or more electrical connections extending between the first and second surfaces;
providing a second semiconductor structure having first and second opposing surfaces, the second semiconductor structure including:
  a first multi-layer section including a first device layer having first and second opposing surfaces and a plurality of electrical connections extending between select portions of the first and second surfaces;
  a second multi-layer section having first and second opposing surfaces, wherein the first surface of the second multi-layer section is disposed over and coupled to the second surface of the first multi-layer section, the second multi-layer section including:
    a second device layer having first and second opposing surfaces and a plurality of electrical connections extending between the first and second surfaces, wherein the second surface of the second device layer corresponds to the second surface of the second multi-layer section; and
    an insulating layer having first and second opposing surfaces, wherein the first surface of the insulating layer corresponds to the first surface of the second multi-layer section, and wherein the first surface of the insulating layer is coupled to the second surface of the first multi-layer section;
  one or more conductive structures extending between select ones of the electrical connections in the first multi-layer section, select ones of the electrical connections in the device layer of the second multi-layer section, and select portions on or beneath the second surface of the second semiconductor structure; and
  one or more interconnect pads having first and second opposing surfaces and one or more sides, wherein the first surface of each one of the interconnect pads is disposed over or beneath select portions of at least the second surface of the second semiconductor structure and select ones of the interconnect pads are electrically coupled to select ones of the one or more conductive structures, wherein the method further includes forming one or more 3D-vias extending from the second surface of the second multi-layer section through the second device layer of the second multi-layer section and through the insulating layer and into the first multi-layer section to electrically connect the device layer of the first multi-layer section the device layer of the second multi-layer
providing one or more interconnect structures, each of the interconnect structures having first and second opposing portions;
coupling the first portion of first select ones of the interconnect structures to select portions of the second surface of the first semiconductor structure; and
coupling the second portion of the first select ones of the interconnect structures to select portions of the second surface of the second semiconductor structure to form one or more electrical connections between the first and second semiconductor structures.

19. The method of claim 18 wherein providing the first semiconductor structure comprises:
providing a multi-chip module (MCM) having first and second opposing surfaces and a plurality of electrical connections extending between select portions of the first and second surfaces, wherein the MCM corresponds to the first semiconductor structure;
wherein coupling the first portion of first select ones of the interconnect structures to select portions of the second surface of the first semiconductor structure comprises:
coupling the first portion of first select ones of the interconnect structures to select ones of the electrical connections in the first semiconductor structure; and
forming a micro bump assembly on the second surface of the first semiconductor structure.

20. The method of claim 18 further comprising:
providing a third semiconductor structure having first and second opposing surfaces;
coupling the first portion of second select ones of the interconnect structures to select portions of the second surface of the third semiconductor structure; and coupling the second portion of the second select ones of the interconnect structures to select portions of the first surface of the first semiconductor structure to form one or more electrical connections between the first and third semiconductor structures.

* * * * *